(12) United States Patent
Lim et al.

(10) Patent No.: US 12,151,617 B2
(45) Date of Patent: Nov. 26, 2024

(54) UNIT PIXEL WITH PHOTOELECTRIC CONVERTERS AND STORAGE MOS CAPACITOR CONNECTED TO PHOTOELECTRIC CONVERTER, IMAGE SENSOR, AND VEHICLE

(71) Applicant: SAMSUNG ELECTRONICS CO., LTD., Suwon-si (KR)

(72) Inventors: Jung Wook Lim, Hwaseong-si (KR); Young Gu Jin, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 17/840,033

(22) Filed: Jun. 14, 2022

(65) Prior Publication Data

US 2023/0076177 A1 Mar. 9, 2023

(30) Foreign Application Priority Data

Sep. 8, 2021 (KR) .................. 10-2021-0119567

(51) Int. Cl.
  *H04N 5/335* (2011.01)
  *B60R 1/22* (2022.01)
  *H01L 27/146* (2006.01)

(52) U.S. Cl.
  CPC .......... *B60R 1/22* (2022.01); *H01L 27/14614* (2013.01); *H01L 27/14643* (2013.01); *B60R 2300/10* (2013.01)

(58) Field of Classification Search
  CPC ............................................. H04N 27/14614
  See application file for complete search history.

(56) References Cited

U.S. PATENT DOCUMENTS

| | | | |
|---|---|---|---|
| 9,214,491 B2 * | 12/2015 | Okita | H01L 27/14609 |
| 10,404,928 B2 * | 9/2019 | Cheung | H04N 25/585 |
| 10,462,402 B2 | 10/2019 | Fan | |
| 10,498,991 B2 | 12/2019 | Van Der Tempel | |
| 2007/0035649 A1 | 2/2007 | McKee | |

(Continued)

FOREIGN PATENT DOCUMENTS

| | | |
|---|---|---|
| KR | 10-2010-0040651 A | 4/2010 |
| KR | 10-2011-0077660 A | 7/2011 |
| KR | 10-2011-0077662 A | 7/2011 |

*Primary Examiner* — Gary C Vieaux
(74) *Attorney, Agent, or Firm* — Sughrue Mion, PLLC

(57) ABSTRACT

A unit pixel includes a first photoelectric converter, a first transfer transistor disposed between to the first photoelectric converter and a first node, a connection transistor disposed between and connected to a second node and the first node, a second transfer transistor disposed between and connected to a third node and the second node, a second photoelectric converter connected to the third node, and a storage metal-oxide semiconductor (MOS) capacitor connected to the third node. The storage MOS capacitor stores charges from the second photoelectric converter. For a first time period, first charges accumulated in the first photoelectric converter are transferred to the first node, for a second time period, second charges accumulated in the first photoelectric converter are transferred to the first node and the second node, and for a third time period, third charges accumulated in the second photoelectric converter are transferred to the first to third nodes.

18 Claims, 38 Drawing Sheets

(56) References Cited

U.S. PATENT DOCUMENTS

| | | | |
|---|---|---|---|
| 2007/0126039 A1* | 6/2007 | Ohta | ............... H01L 27/14603 |
| | | | 348/E3.018 |
| 2008/0105909 A1 | 5/2008 | Ham et al. | |
| 2009/0078975 A1 | 3/2009 | Kim et al. | |
| 2018/0241955 A1* | 8/2018 | Sakano | ............... H04N 25/59 |
| 2020/0137339 A1 | 4/2020 | Mn et al. | |
| 2020/0176493 A1 | 6/2020 | Ikeda et al. | |
| 2023/0088705 A1* | 3/2023 | Lim | ............... H04N 25/767 |
| | | | 348/241 |

* cited by examiner

UNIT PIXEL WITH PHOTOELECTRIC CONVERTERS AND STORAGE MOS CAPACITOR CONNECTED TO PHOTOELECTRIC CONVERTER, IMAGE SENSOR, AND VEHICLE

CROSS-REFERENCE TO RELATED APPLICATION

This application claims priority from Korean Patent Application No. 10-2021-0119567 filed on Sep. 8, 2021 in the Korean Intellectual Property Office, the entire contents of which is herein incorporated by reference in its entirety.

BACKGROUND

The present disclosure relates to a unit pixel, an image sensor, and a vehicle and, more particularly, to a unit pixel, an image sensor including the unit pixel, and a vehicle including the image sensor.

An image sensing device refers to a semiconductor element that converts optical information into an electrical signal. The image sensing device may include a charge-coupled device (CCD) and a complementary metal-oxide semiconductor (CMOS) image sensing device.

The CMOS image sensor may be abbreviated as CIS (CMOS image sensor). The CIS may include a plurality of pixels arranged two-dimensionally. Each of the pixels may include, for example, a photodiode (PD). The photodiode may serve to convert incident light thereto into an electrical signal.

Recently, demand for an image sensor with improved performance is increasing in various fields such as a digital camera, a camcorder, a smartphone, a game device, a security camera, a medical micro camera, a robot, and a vehicle.

SUMMARY

It is an aspect to provide a unit pixel having improved image quality.

It is another aspect to provide an image sensor with improved image quality.

It is yet another aspect to provide a vehicle including an image sensor with improved image quality.

According to an aspect of one or more embodiments, there is provided a unit pixel comprising a first photoelectric converter; a first transfer transistor disposed between the first photoelectric converter and a first node and connected to the first photoelectric converter and the first node; a connection transistor disposed between a second node and the first node and connected to the second node and the first node; a second transfer transistor disposed between a third node and the second node and connected to the third node and the second node; a second photoelectric converter connected to the third node; and a storage MOS (metal-oxide semiconductor) capacitor connected to the third node, wherein the storage MOS capacitor stores charges from the second photoelectric converter, wherein the unit pixel is configured such that for a first time period, first charges accumulated in the first photoelectric converter are transferred to the first node via the first transfer transistor, and a first signal voltage corresponding to the first charges is output from the unit pixel; for a second time period following the first time period, second charges accumulated in the first photoelectric converter are transferred to the first node and the second node via the first transfer transistor and the connection transistor, and a second signal voltage corresponding to the second charges is output from the unit pixel; and for a third time period following the second time period, third charges accumulated in the second photoelectric converter are transferred to the first node, the second node, and the third node via the second transfer transistor and the connection transistor, and a third signal voltage corresponding to the third charges is output from the unit pixel.

According to another aspect of one or more embodiments, there is provided an image sensor comprising a pixel array including unit pixels; and a read-out circuit, wherein each of the unit pixels includes a first photoelectric converter; a source follower connected to the read-out circuit; a first transfer transistor disposed between the first photoelectric converter and the source follower and connected to the first photoelectric converter and the source follower; a second photoelectric converter different from the first photoelectric converter; a second transfer transistor having one end connected to the second photoelectric converter; a connection transistor configured to connect the other end of the second transfer transistor to the first transfer transistor and to the source follower; and a storage MOS capacitor having one end connected to the second photoelectric converter, wherein the storage MOS capacitor stores charges from the second photoelectric converter.

According to yet another aspect of one or more embodiments, there is provided a unit pixel comprising a first photoelectric converter; a first transfer transistor disposed between the first photoelectric converter and a first node and connected to the first photoelectric converter and the first node; a connection transistor disposed between a second node and the first node and connected to the second node and the first node; a first switch disposed between a third node and the second node and connected to the third node and the second node; a second transfer transistor connected to the third node; a second photoelectric converter connected to the second transfer transistor; a capacitor disposed between a fourth node and the third node and connected to the fourth node and the third node, wherein the capacitor stores overflow charges which have overflowed from the second photoelectric converter; and a capacitor discharge transistor having ends respectively connected to the third node and the fourth node.

According to yet another aspect of one or more embodiments, there is provided an image sensor comprising a read-out circuit; and a pixel array including a photoelectric converter; a transfer transistor disposed between the photoelectric converter and a first node and connected to the photoelectric converter and the first node; a source follower having a gate connected to the first node; a reset transistor connected to the first node; a capacitor disposed between a second node and the first node and connected to the second node and the first node; and a capacitor discharge transistor having ends respectively connected to the first node and the second node.

According to yet another aspect of one or more embodiments, there is provided a vehicle comprising an electronic control unit; and an image sensor connected to the electronic control unit, wherein the image sensor includes a pixel array including unit pixels; and a read-out circuit for connecting the pixel array to and the electronic control unit, wherein each of the unit pixels includes a first photoelectric converter; a source follower connected to the read-out circuit; a first transfer transistor disposed between the first photoelectric converter and the source follower and connected to the first photoelectric converter and the source follower; a second photoelectric converter different from the first photoelectric converter; a second transfer transistor having one end connected to the second photoelectric converter; a connection transistor configured to connect the other end of the second transfer transistor to the first transfer transistor and to the source follower; and a storage MOS capacitor having one end connected to the second photoelectric converter, wherein the storage MOS capacitor receives charges from the second photoelectric converter.

According to yet another aspect of one or more embodiments, there is provided a unit pixel comprising a first photoelectric converter; a first transfer transistor disposed between the first photoelectric converter and a first node and connected to the first photoelectric converter and the first node; a connection transistor disposed between a second node and the first node and connected to the second node and the first node; a first switch disposed between a third node and the second node and connected to the third node and the second node; the second transfer transistor disposed between a fourth node and the third node and connected to the fourth node and the third node; a second photoelectric converter connected to the fourth node; a storage MOS capacitor connected to the fourth node, wherein the storage MOS capacitor stores charges from the second photoelectric converter; a capacitor disposed between a fifth node and the third node and connected to the fifth node and the third node, wherein the capacitor stores overflow charges which have overflowed from the second photoelectric converter; and a capacitor discharge transistor having ends respectively connected to the third node and the fifth node.

BRIEF DESCRIPTION OF DRAWINGS

The above and other aspects will become more apparent by describing in detail exemplary embodiments thereof with reference to the attached drawings, in which.

DETAILED DESCRIPTIONS

Figure 1:
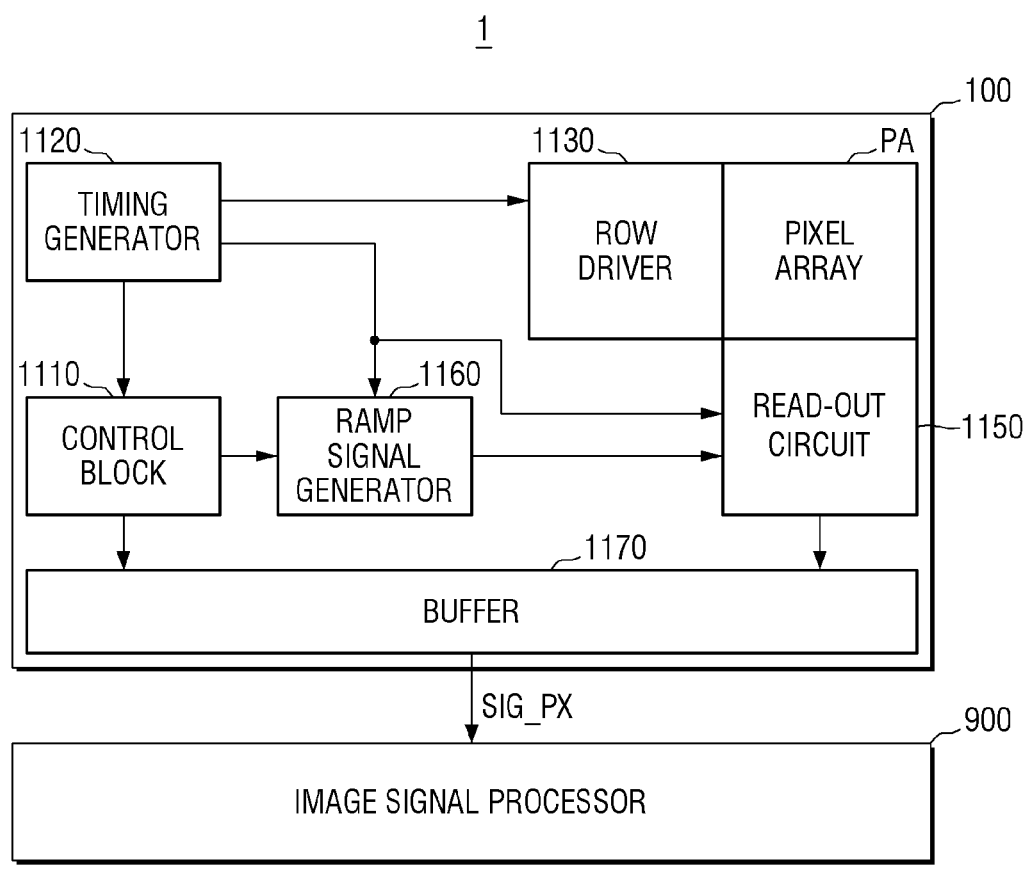
FIG. 1 is a block diagram of an image sensing device according to some embodiments.

Embodiments are not limited to the above-mentioned aspects. Other aspects that are not mentioned may be understood based on following descriptions, and may be more clearly understood based on various embodiments described herein. Further, it will be easily understood that the aspects and advantages may be realized using means shown in the claims and combinations thereof.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a "first" element, component, region, layer or section described below could be termed a "second" element, component, region, layer or section, without departing from the spirit and scope of the present disclosure.

Hereinafter, various embodiments will be described in detail with reference to the accompanying drawings. The same reference numerals are used for the same components in the drawings, and duplicate descriptions thereof are omitted for conciseness.

FIG. 1 is a block diagram of an image sensing device according to some embodiments.

Referring to FIG. 1, an image sensing device 1 may include an image sensor 100 and an image signal processor 900.

The image sensor 100 may include a control block 1110, a timing generator 1120, a row drier 1130, a read-out circuit 1150, a ramp signal generator 1160, a buffer 1170, and a pixel array PA. The image sensor 100 may sense an image of a sensing target using light to generate a pixel signal SIG_PX. In some embodiments, the generated pixel signal SIG_PX may be, for example, a digital signal. However, embodiments are not limited thereto. Further, the pixel signal SIG_PX may include specific signal voltage or reset voltage.

The pixel signal SIG_PX may be provided to the image signal processor 900 in which the pixel signal is processed. The image signal processor 900 may receive the pixel signal SIG_PX output from the buffer 1170 of the image sensor 100 and process the received pixel signal SIG_PX for display.

In some embodiments, the image signal processor 900 may perform digital binning on the pixel signal SIG_PX output from the image sensor 100. In this connection, the pixel signal SIG_PX output from the image sensor 100 may be a raw image signal from the pixel array PA not subjected to analog binning, or may be a pixel signal SIG_PX subjected to the analog binning.

In some embodiments, the image sensor 100 and the image signal processor 900 may be disposed separately from each other as shown. For example, the image sensor 100 may be mounted on a first chip, while the image signal processor 900 may be mounted on a second chip different from the first chip. The image sensor 100 and the image signal processor 900 may communicate with each other over a predefined interface. However, embodiments are not limited thereto. In some embodiments, the image sensor 100 and the image signal processor 900 may be implemented as one package, for example, multi-chip package (MCP).

The control register block 1110 may control all operations of the image sensor 100. In particular, the control register block 1110 may directly transmit a control signal to the timing generator 1120, the ramp signal generator 1160 and the buffer 1170.

The timing generator 1120 may generate a signal that acts as a reference signal for operation timings of various components of the image sensor 100. The reference signal for the operation timing as generated by the timing generator 1120 may be transmitted to the row driver 1130, the read-out circuit 1150, the ramp signal generator 1160, and the like.

The ramp signal generator 1160 may generate and transmit a ramp signal to the read-out circuit 1150. For example, the read-out circuit 1150 may include a correlated double sampler (CDS), a comparator, etc. The ramp signal generator 1160 may generate the ramp signal used in the correlated double sampler (CDS), the comparator, and the like and transmit the ramp signal thereto.

The buffer 1170 may include, for example, a latch unit. The buffer 1170 may temporarily store therein the pixel signal SIG_PX to be provided to an outside of the image sensor 100, and may transmit the pixel signal SIG_PX to an external memory or an external device. For example, the buffer 1170 may transmit the pixel signal SIG_PX to the image signal processor 900 as described above. The buffer 1170 may include a memory such as DRAM or SRAM.

The pixel array PA may sense an external image. The pixel array PA may include a plurality of pixels (or unit pixels). The row driver 1130 may selectively activate a row of the pixel array PA.

The read-out circuit 1150 samples the pixel signal provided from the pixel array PA, compares the sampled pixel signal with the ramp signal, and then converts an analog image signal data into a digital image signal data based on the comparison result.

Figure 2:
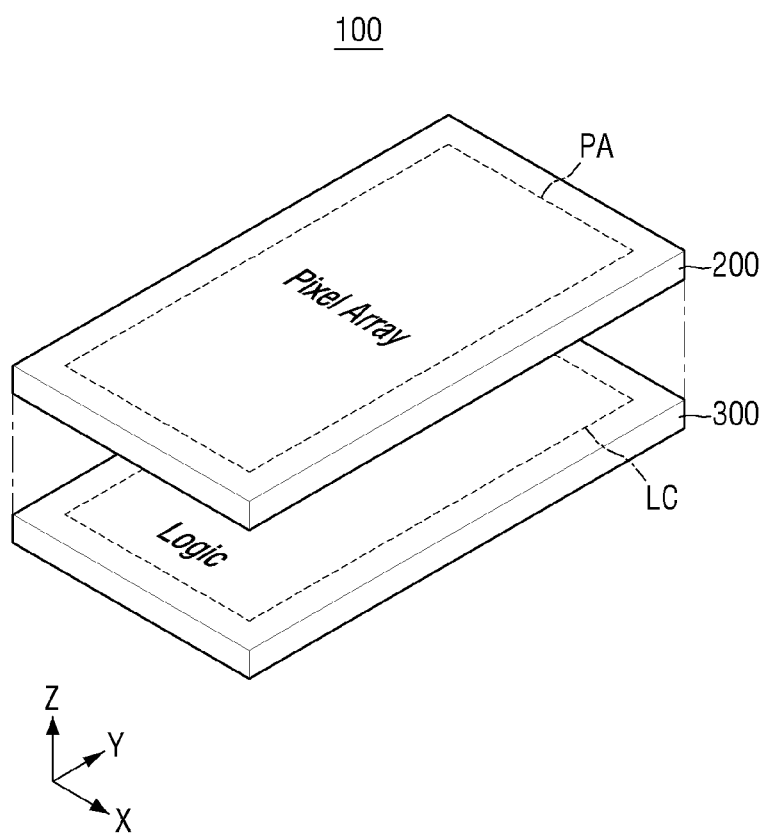
FIG. 2 is a diagram for illustrating a conceptual layout of an image sensor according to some embodiments.

FIG. 2 is a diagram for illustrating a conceptual layout of an image sensor according to some embodiments.

Referring to FIG. 2, an image sensor 100 may include an upper chip 200 and a lower chip 300 stacked vertically (i.e., in a Z direction). A plurality of pixels may be disposed in the upper chip 200 and in a two-dimensional array structure. That is, the upper chip 200 may include the pixel array PA. In some embodiments, the lower chip 300 may include an analog area and a logic area LC. In some embodiments, the analog area may include the read-out circuit 1150. The lower chip 300 may be disposed below the upper chip 200, and may be electrically connected to the upper chip 200. The lower chip 300 may receive the pixel signal from the upper chip 200. The logic area LC may receive the pixel signal.

Logic elements may be disposed in the logic area LC of the lower chip 300. The logic elements may include circuits for processing the pixel signal from the pixels. For example, in some embodiments, the logic elements may include the control block 1110, the timing generator 1120, the row driver 1130, the read-out circuit 1150, the ramp signal generator 1160, or the like in FIG. 1.

Figure 3:
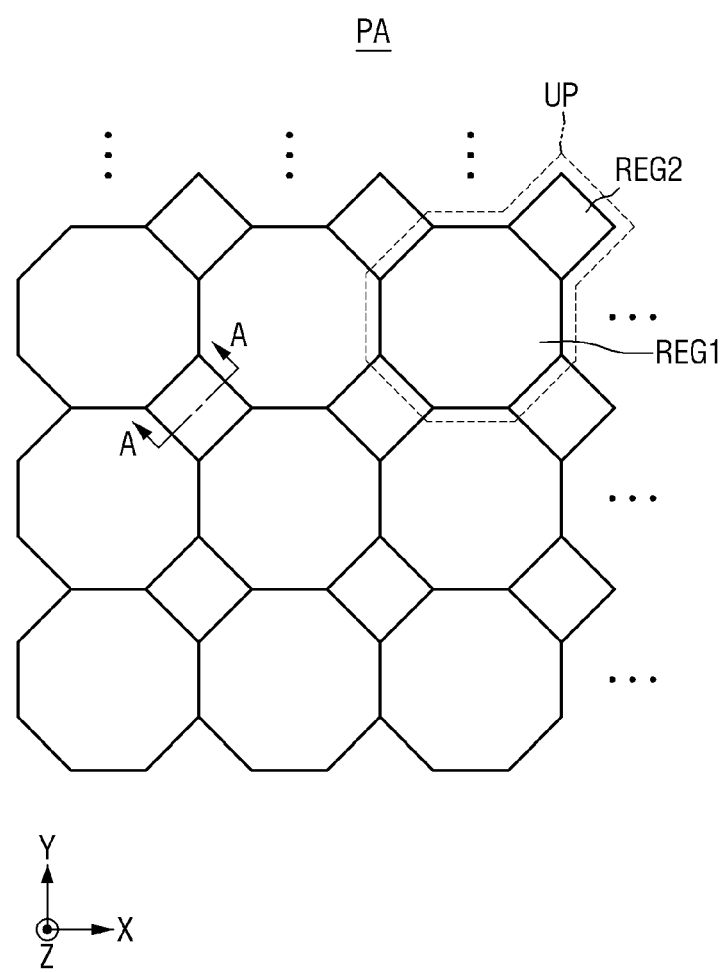
FIG. 3 is a top view of a pixel array according to some embodiments.

FIG. 3 is a top view of a pixel array according to some embodiments.

Referring to FIG. 3, the pixel array PA may include a plurality of unit pixels UP. For example, the plurality of unit pixels UP may be regularly arranged in a first direction (i.e., an X direction) and a second direction (i.e., a Y direction). The unit pixel UP may be a unit of a pixel that receives light and outputs an image corresponding to one pixel.

The unit pixel UP may include a first area REG1 and a second area REG2. In some embodiments, the first area REG1 and the second area REG2 may be distinguished from each other in a top view. The first area REG1 may have an octagonal shape as shown in FIG. 3. The second area REG2 may have a rectangular shape as shown. However, embodiments are not limited thereto. In some embodiments, the first area REG1 and the second area REG2 may contact each other. A size of the first area REG1 may be larger than a size of the second area REG2. In other words, the first area REG1 may have a planar area (i.e., the first and second directions) larger than an planar area of the second area REG2. Accordingly, an amount of light incident onto the first area REG1 may be greater than an amount of light incident onto the second area REG2. The unit pixel UP including the first area REG1 and the second area REG2 may convert light to an electrical signal.

Figure 4:
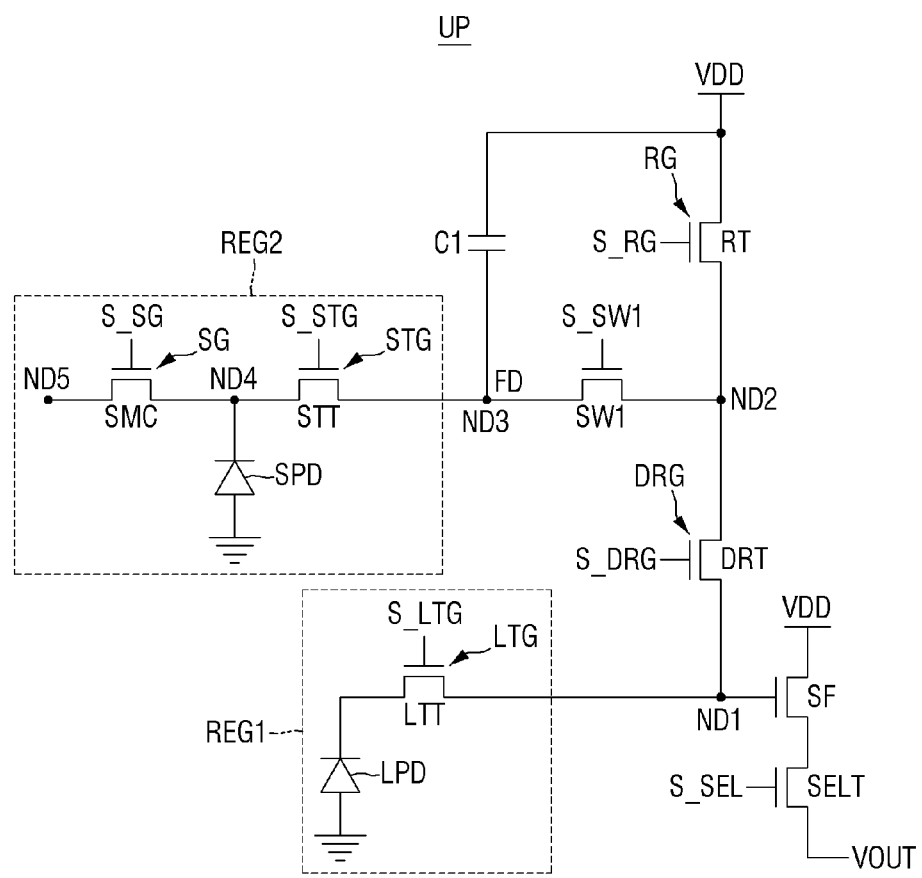
FIG. 4 is a circuit diagram of a unit pixel according to some embodiments.

FIG. 4 is a circuit diagram of a unit pixel according to some embodiments.

Referring to FIG. 4, the unit pixel UP may include a large photodiode LPD, a small photodiode SPD, a large transfer transistor LTT, a small transfer transistor STT, a source follower SF, a select transistor SELT, a connection transistor DRT, a reset transistor RT, a first switch SW1, a first capacitor C1, and a storage metal oxide semiconductor (MOS) capacitor SMC.

The large photodiode LPD may correspond to a photoelectric converter. That is, the large photodiode LPD may convert light incident to the first area REG1 into charges. The large photodiode LPD may be disposed in the first area REG1. Further, the large photodiode LPD may store therein the generated charges. One end of the large photodiode LPD may be connected to a ground voltage. The large transfer transistor LTT may be disposed between the large photodiode LPD and a first node ND1, and the large transfer transistor LTT may be connected to the large photodiode LPD and the first node ND1. That is, one end of the large transfer transistor LTT may be connected to one end of the large photodiode LPD and another end of the large transfer transistor LTT may be connected to the first node ND1. The large transfer transistor LTT may include a large transfer gate LTG. A large transfer gate signal S_LTG may be applied to the large transfer gate LTG to control the large transfer transistor LTT. For example, when the large transfer gate signal S_LTG is pulled-up, the large transfer transistor LTT may be turned on so that the charges generated from the large photodiode LPD may be transferred to the first node ND1. The first node ND1 may correspond to a floating diffusion node of the unit pixel UP. The large transfer transistor LTT may be disposed in the first area REG1. However, embodiments are not limited thereto.

A gate of the source follower SF may be connected to the first node ND1. That is, the gate of the source follower SF may be connected to the floating diffusion node, such that the charges may be applied thereto. The source follower SF may be connected to a power voltage VDD and one end of the select transistor SELT. The source follower SF may operate based on the charges applied to the first node ND1. The select transistor SELT may be connected to the source follower SF and an output voltage VOUT. A selection signal S_SEL may be applied to a gate of the select transistor SELT to control the select transistor SELT. The select transistor SELT may operate only while the unit pixel UP is operating.

The connection transistor DRT may be disposed between the first node ND1 and a second node ND2, and the connection transistor DRT may be connected to the first node ND1 and the second node ND2. Further, the connection transistor DRT may include a connection gate DRG to which a connection gate signal S_DRG is applied. The connection transistor DRT may connect the first node ND1 and the second node ND2 to each other when the connection gate signal S_DRG is pulled-up. The reset transistor RT may be disposed between the second node ND2 and the power voltage VDD and the reset transistor RT may be connected to the second node ND2 and the power voltage VDD. The reset transistor RT may include a reset gate RG to which a reset gate signal S_RG is applied. The reset transistor RT may connect the second node ND2 to the power voltage VDD when the reset gate signal S_RG is pulled-up, thereby resetting the unit pixel UP.

The first switch SW1 may be disposed between the second node ND2 and a third node ND3, and the first switch SW1 may be connected to the second node ND2 and the third node ND3. A first switch signal S_SW1 may be applied to a gate of the first switch SW1 to connect the third node ND3 and the second node ND2 to each other. The first capacitor C1 may be disposed between the third node ND3 and the power voltage VDD and be connected to the third node ND3 and the power voltage VDD. That is, the first capacitor C1 may be connected to each of the first switch SW1, the reset transistor RT, and the small transfer transistor STT. The first capacitor C1 may receive charges overflowing from the small photodiode SPD. Further, the first capacitor C1 may store therein the charges overflowing from the small photodiode SPD. In some embodiments, the first capacitor C1 may not be disposed outside of the second area REG2 so as not to be in the second area REG2. For example, the first capacitor C1 may be disposed in the lower chip 300 in FIG. 2.

The small photodiode SPD may correspond to a photoelectric converter. That is, the small photodiode SPD may convert light incident to the second area REG2 into charges. The small photodiode SPD may be disposed in the second area REG2. Further, the small photodiode SPD may store therein the generated charges. One end of the small photodiode SPD may be connected to a fourth node ND4. The other end of the small photodiode SPD may be connected to a ground voltage. The ground voltage may be the same voltage as the ground voltage to which the large photodiode LPD is connected. The small transfer transistor STT may be disposed between the fourth node ND4 and the third node ND3 and may be connected to the fourth node ND4 and the third node ND3. The small transfer transistor STT may include a small transfer gate STG. A small transfer gate signal S_STG may be applied to the small transfer gate STG to control the small transfer transistor STT. For example, when the small transfer gate signal S_STG is pulled-up, the small transfer transistor STT is turned on such that the charges generated from the small photodiode SPD may be transferred to the third node ND3. In some embodiments, the third node ND3 may correspond to a floating diffusion node of the unit pixel UP. That is, the third node ND3 may correspond to a different floating diffusion node than the floating diffusion node corresponding to the first node ND1. In some embodiments, the floating diffusion node corresponding to the first node ND1 may be referred to as a first floating diffusion node, and the floating diffusion node corresponding to the third node ND3 may be referred to as a second floating diffusion node. The small transfer transistor STT may be disposed in the second area REG2. However, embodiments are not limited thereto.

The storage MOS capacitor SMC may be disposed between the fourth node ND4 and a fifth node ND5, and the storage MS capacitor SMC may be connected to the fourth node ND4 and the fifth node ND5. In some embodiments, the storage MOS capacitor SMC may include an insulating layer and a gate electrode sequentially stacked on a substrate. The storage MOS capacitor SMC may be a kind of a capacitor. The storage MOS capacitor SMC may be connected to the fourth node ND4 and thus may be connected to both the small photodiode SPD and the small transfer transistor STT. That is, the storage MOS capacitor SMC may be connected to both the fourth node ND4 and the fifth node ND5. The fifth node ND5 may be in a floating state. For example, in some embodiments, no voltage is applied to the fifth node ND5. Accordingly, a channel is not formed between the fourth node ND4 and the fifth node ND5. The storage MOS capacitor SMC may include a storage gate SG to which a storage gate signal S_SG is applied. The storage gate signal S_SG may control an operation of the storage MOS capacitor SMC. The storage MOS capacitor SMC may be disposed in the second area REG2. However, embodiments are not limited thereto.

The storage MOS capacitor SMC may be disposed adjacent to the small photodiode SPD and receive the charges from the small photodiode SPD and may store therein the charges. For example, when the charges generated from the small photodiode SPD fully fill the small photodiode SPD such that overflow charges are generated, the overflow charges may be transferred from the small photodiode SPD to the storage MOS capacitor SMC for storage. Thereafter, when the storage MOS capacitor SMC is fully charged, the overflow charges stored in the storage MOS capacitor SMC and the charges stored in the small photodiode SPD may be transferred to the first capacitor C1. An amount of charges stored in the storage MOS capacitor SMC may be controlled by adjusting the storage gate signal S_SG applied to the storage MOS capacitor SMC. In the unit pixel UP, the second area REG2 in which the small photodiode SPD is disposed may be smaller than the first area REG1. Therefore, the small photodiode SPD may not sufficiently store therein the charges generated based on the received light. The storage MOS capacitor SMC may store the charges from the small photodiode SPD therein to increase a full well capacity (FWC). That is, when the charges are stored in the storage MOS capacitor SMC, a capacitance may be increased, thereby increasing the full well capacity. Further, in this way, a dynamic range Dr of a signal output from the unit pixel UP may increase.

Figure 5A:
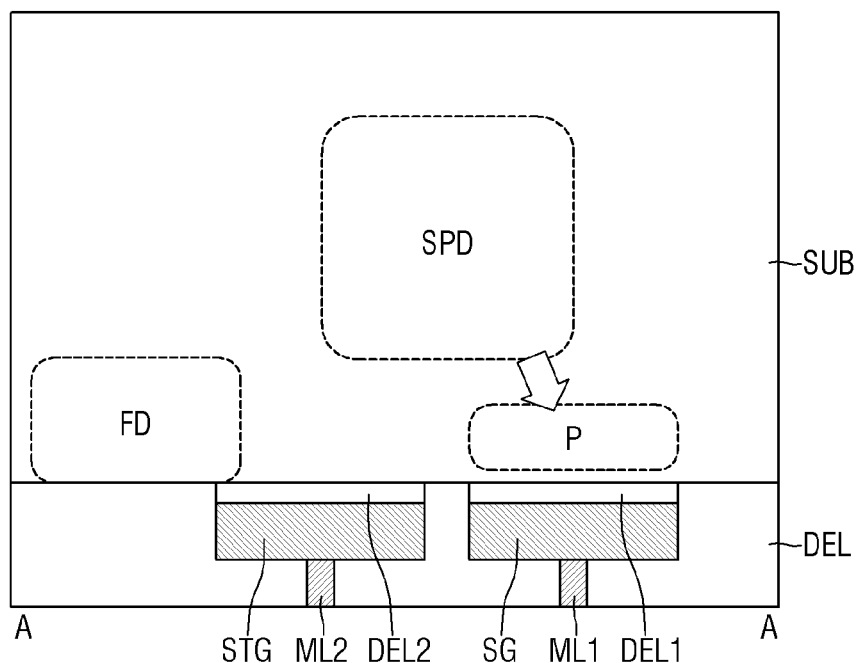
FIG. 5A is a cross-sectional view of the unit pixel cut along a line A-A of FIG. 3.
Figure 5B:
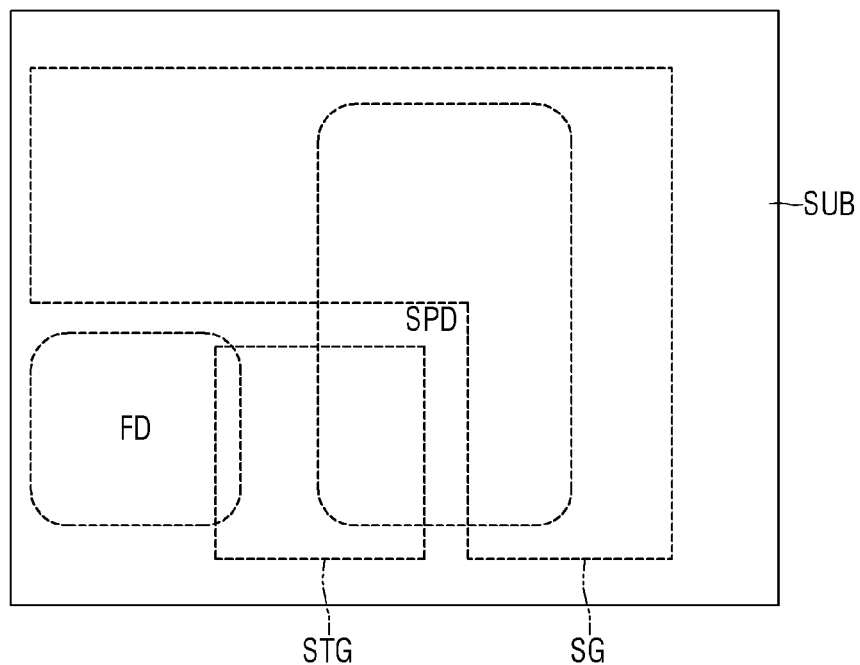
FIG. 5B is a top face view of the unit pixel of FIG. 3.

FIG. 5A is a cross-sectional view of the unit pixel cut along a line A-A of FIG. 3. FIG. 5B is a top face view of the unit pixel of FIG. 3.

Referring to FIG. 5A, the unit pixel UP may include a substrate SUB, an insulating layer DEL, a small photodiode SPD, a floating diffusion node FD, a first insulating layer DEL1, a storage gate SG, a first metal layer ML1, a second insulating layer DEL2, a small transfer gate STG, a second metal layer ML2, etc. In some embodiments, the small transfer gate STG may be included in the small transfer transistor STT of FIG. 4, and the storage gate SG may be included in the storage MOS capacitor SMC in FIG. 4. Further, the floating diffusion node FD may correspond to the fourth node ND4 in FIG. 4. In some embodiments, the first metal layer ML1 and the second metal layer ML2 may include the same metal. In some embodiments, the first insulating layer DEL1 and the second insulating layer DEL2 may include the same insulating material.

The substrate SUB may be disposed on the insulating layer DEL. A top face of the substrate SUB may correspond to a light incident face. The small photodiode SPD and the floating diffusion node FD may be disposed in the substrate SUB. The small photodiode SPD may convert light incident from the top face of the substrate SUB into charges. The small photodiode SPD may be disposed adjacent to the storage gate SG and the small transfer gate STG.

The storage gate SG may be disposed on the first insulating layer DEL1. Further, the storage gate SG may be connected to another circuit via the first metal layer ML1. The storage gate SG may receive the storage gate signal S_SG through the first metal layer ML1. When the storage gate signal S_SG is applied to the storage gate SG, the charges may be stored in a portion P of the substrate SUB under the first insulating layer DELL That is, the charges from the small photodiode SPD adjacent thereto may be stored in the portion below the storage gate SG.

The small transfer gate STG may be disposed on the second insulating layer DEL2. The small transfer gate STG may be connected to another circuit via the second metal layer ML2. The small transfer gate STG may receive a small transfer gate signal S_STG through the second metal layer ML2. When the small transfer gate signal S_STG is applied to the small transfer gate STG, a channel may be formed in a portion of the substrate SUB under the second insulating layer DEL2. In this case, the charges may move from the small photodiode SPD to the floating diffusion node FD. That is, the small transfer gate STG may connect the small photodiode SPD and the floating diffusion node FD to each other.

In the embodiment illustrated in FIG. 5A, the storage gate SG and the small transfer gate STG are shown to be disposed in the insulating layer DEL. However, embodiments are not limited thereto. In some embodiments, a vertical gate in which a portion of a gate area is disposed inside the substrate SUB may be implemented.

Referring to FIG. 5B, the floating diffusion node FD may be arranged adjacent to the small photodiode SPD. For example, the floating diffusion node FD may be formed at one side around the small photodiode SPD. For example, the floating diffusion node FD may be adjacent to a lower left portion of the small photodiode SPD. The floating diffusion node FD and the small photodiode SPD may be located in the substrate SUB.

The small transfer gate STG may be disposed between the floating diffusion node FD and the small photodiode SPD and connected to the floating diffusion node FD and the small photodiode SPD. The small transfer gate STG may partially overlap the floating diffusion node FD and the small photodiode SPD as illustrated in FIG. 5B. The storage gate SG may overlap a portion of the small photodiode SPD. However, the storage gate SG may not overlap the floating diffusion node FD. In some embodiments, the storage gate SG may be formed to surround at least two sides of the small transfer gate STG and the floating diffusion node FD. That is, an area of the storage gate SG may be larger than an area of the small transfer gate STG. Accordingly, an amount of charges stored in the storage gate SG may be larger than an amount of charges stored in the small transfer gate STG.

Hereinafter, an operation of the unit pixel UP will be described with reference to FIG. 4 to FIG. 12.

Figure 6:
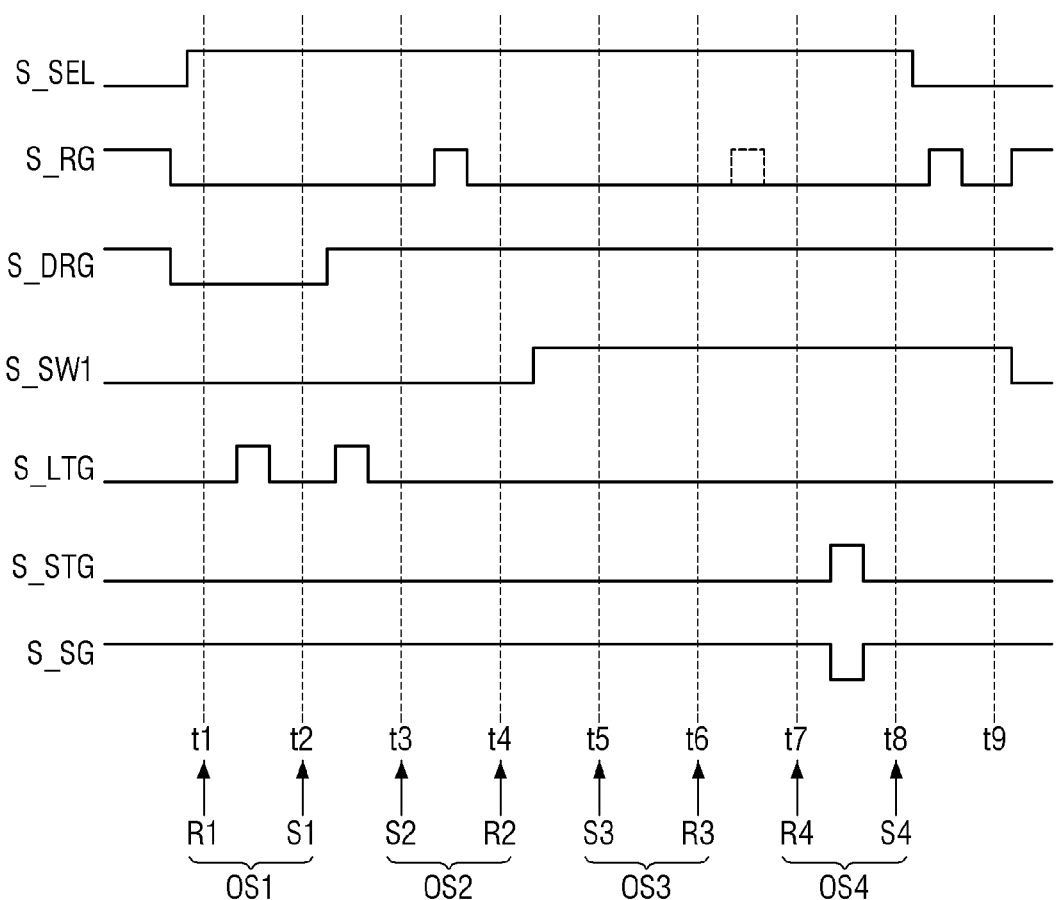
FIG. 6 is an example of a timing diagram for illustrating a method of operating the unit pixel according to some embodiments.
Figure 7:
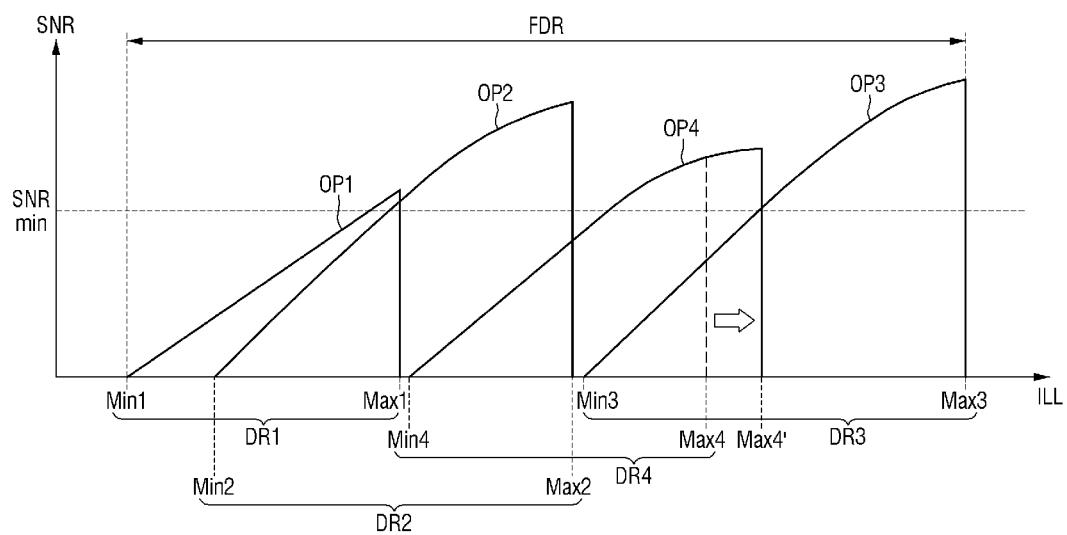
FIG. 7 is a diagram of a signal-to-noise ratio based on illuminance of the unit pixel in the operation of the unit pixel according to some embodiments.

FIG. 6 is a timing diagram for illustrating a method of operating the unit pixel according to some embodiments. FIG. 7 is a diagram of a signal-to-noise ratio based on illuminance of the unit pixel in the operation of the unit pixel according to some embodiments. FIGS. 8 to 11 are diagrams for illustrating the operation of the unit pixel, according to some embodiments. FIG. 12 is a diagram for illustrating a voltage output from the image sensor.

Referring to FIG. 4 to FIG. 12, the unit pixel UP may perform a first reset operation R1 at a first time t1. At a time before the first time t1, the selection signal S_SEL may be pulled-up, and the reset gate signal S_RG may be pulled-down, and the connection gate signal S_DRG may be pulled-down. Further, the first switch signal S_SW1, the large transfer gate signal S_LTG and the small transfer gate signal S_STG may be in a turned off state. The storage gate signal S_SG may be in a turned-on state. Thus, a first reset voltage VR1 to which the charges accumulated in the first node ND1 are converted may be output at the first time t1. In this connection, the source follower SF may convert the charges accumulated on the first node ND1 to the first reset voltage VR1.

Figure 8:
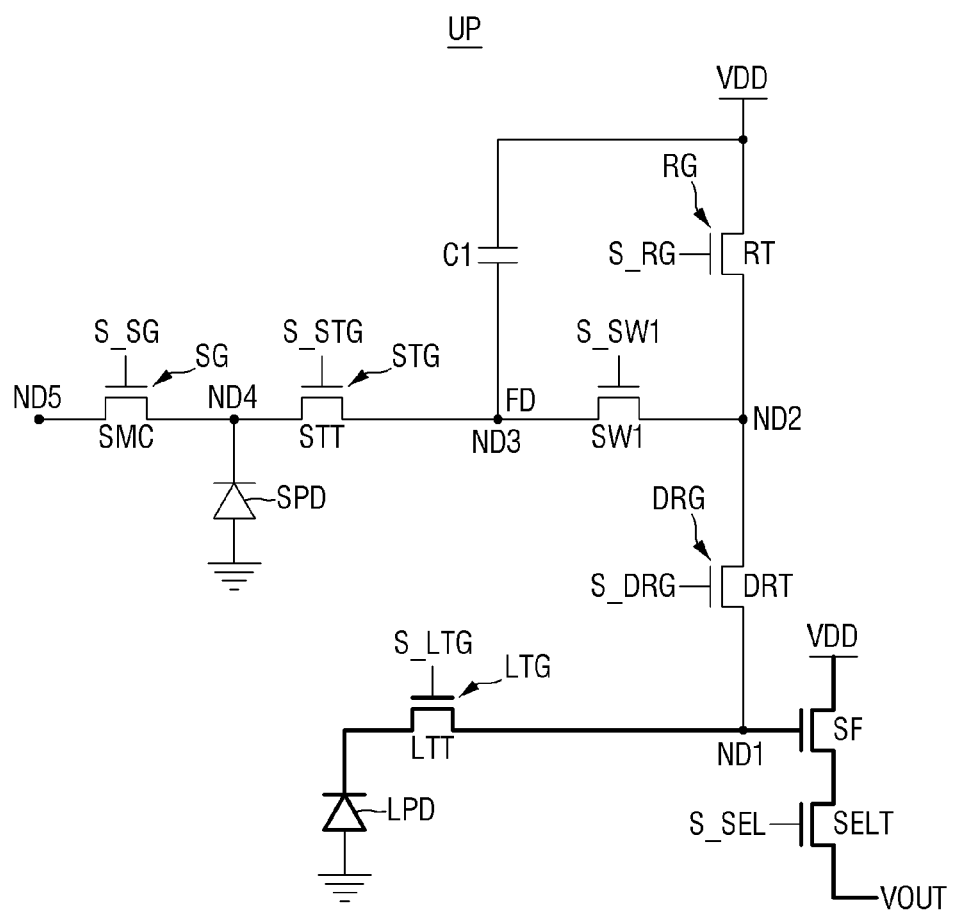
FIGS. 8 to 11 are diagrams for illustrating the operation of the unit pixel, according to some embodiments.

Referring to FIG. 6 to FIG. 8, the unit pixel UP may perform a first signal operation S1 at a second time t2. For a time period between the first time t1 and the second time t2, the large transfer gate signal S_LTG may be pulled-up and then pulled-down. It is noted that the time period may be less than the total time period from the first time t1 to the second time t2. As the large transfer gate signal S_LTG is pulled-up, the large transfer transistor LTT may be turned on. That is, the large transfer transistor LTT may connect the large photodiode LPD and the first node ND1 to each other. The large photodiode LPD may store therein charges before the large transfer gate signal S_LTG is pulled-up. The large transfer transistor LTT may transfer the charges generated from the large photodiode LPD to the first node ND1, that is, the floating diffusion node. In this connection, the charges transferred to the first node ND1 may be converted to a first signal voltage VS1 by the source follower SF. That is, the output voltage VOUT may be the first signal voltage VS1. In this case, a capacitance of the floating diffusion node of the unit pixel UP may be small. Accordingly, the full well capacity thereof may be small.

Referring to FIG. 7, a first operation OP1 may include the first reset operation R1 and the first signal operation S1. The first operation OP1 may have a first minimum illuminance Min1 and a first maximum illuminance Max1. That is, the first operation OP1 may correspond to a first dynamic range DR1 from the first minimum illuminance Min1 to the first maximum illuminance Max1. A signal output for the first operation OP1 may have the first dynamic range DR1. The first dynamic range DR1 may be used for image sensing in a low-illuminance environment.

Figure 9:
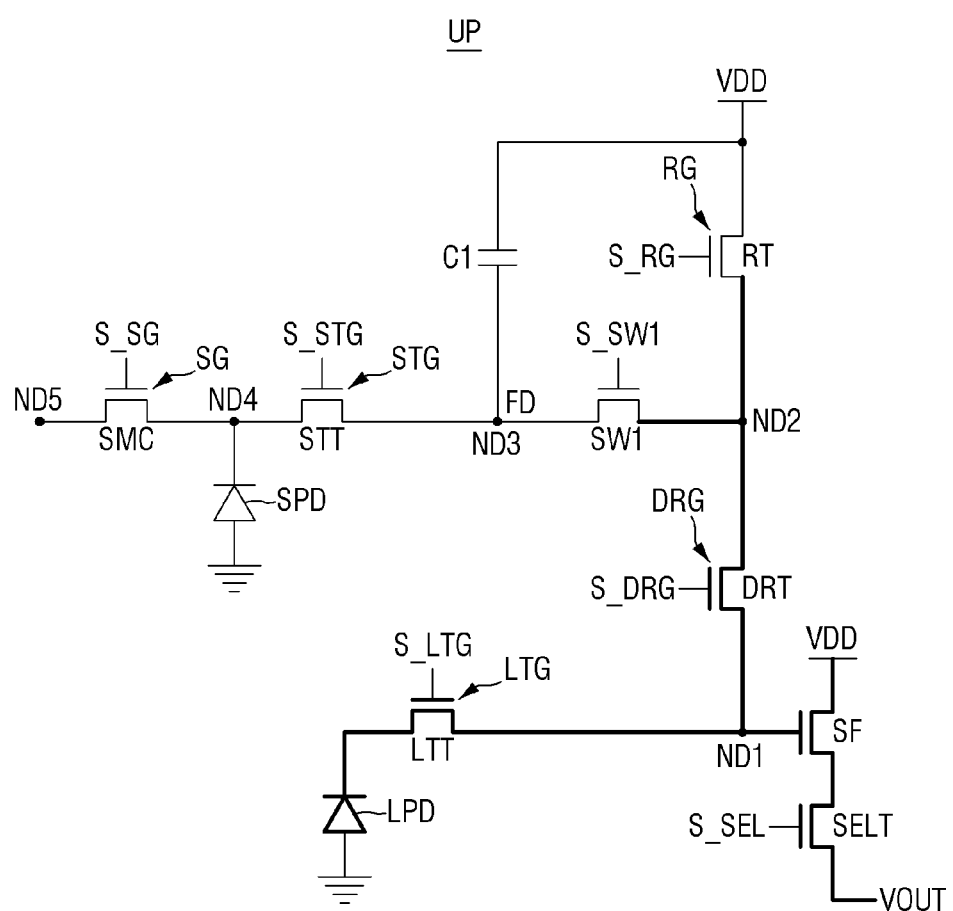

Referring to FIG. 4, FIG. 6 and FIG. 9, the unit pixel UP may perform a second signal operation S2 at a third time t3. At a time between the second time t2 and the third time t3, the connection gate signal S_DRG may be pulled-up, and for a time period between the second time t2 and the third time t3, the large transfer gate signal S_LTG may be pulled-up and then pulled-down. The time period may be less than a total time period from the second time t2 to the third time t3. As the connection gate signal S_DRG is pulled-up, the connection transistor DRT may connect the first node ND1 and the second node ND2 to each other. That is, the floating diffusion node of the unit pixel UP may have a capacitance including capacitances of the first node ND1 and the second node ND2. Further, as the large transfer gate signal S_LTG is pulled-up, the charges may be transferred from the large photodiode LPD to the first node ND1 and the second node ND2. That is, the charges transmitted to the first node ND1 and the second node ND2 may be converted into a second signal voltage VS2 by the source follower SF. That is, the output voltage VOUT may be the second signal voltage VS2.

Further, the unit pixel UP may perform a second reset operation R2 at a fourth time t4. For a time period between the third time t3 and the fourth time t4, the reset gate signal S_RG may be pulled-up and then pulled-down. The time period may be less than a total time period from the third time t3 to the fourth time t4. Accordingly, the charges of the first node ND1 and the second node ND2 may be reset by the reset transistor RT. The source follower SF may convert the charges of the first node ND1 and the second node ND2 after the reset to the second reset voltage VR2 and then output the second reset voltage VR2.

Referring to FIG. 7, a second operation OP2 may include the second reset operation R2 and the second signal operation S2. The second operation OP2 may have a second minimum illuminance Min2 and a second maximum illuminance Max2. That is, the second operation OP2 may correspond to a second dynamic range DR2 from the second minimum illuminance Min2 to the second maximum illuminance Max2. A signal output for the second operation OP2 may have the second dynamic range DR2. In some embodiments, the second dynamic range DR2 may partially overlap with the first dynamic range DR1. The second dynamic range DR2 may have the second minimum illuminance Min2 higher than the first minimum illuminance Min1, and the second maximum illuminance Max2 higher than the first maximum illuminance Max1. In some embodiments, a signal-to-noise ratio of the second operation OP2 may be greater than a minimum signal-to-noise ratio SNRmin. In this connection, the unit pixel UP may output a signal with lowered noise and a wider dynamic range.

The large photodiode LPD may correspond to a more sensitive photoelectric converter. Therefore, even when receiving a small amount of light, the large photodiode LPD may react with the small amount of light. However, since the small photodiode SPD is less sensitive compared to the large photodiode LPD, the small photodiode SPD may not react with the small amount of light. The first operation OP1 and the second operation OP2 may have the first dynamic range DR1 and the second dynamic range DR2, respectively, because the large photodiode LPD may react with the small amount of light during the first operation OP1 and the second operation OP2.

Figure 10:
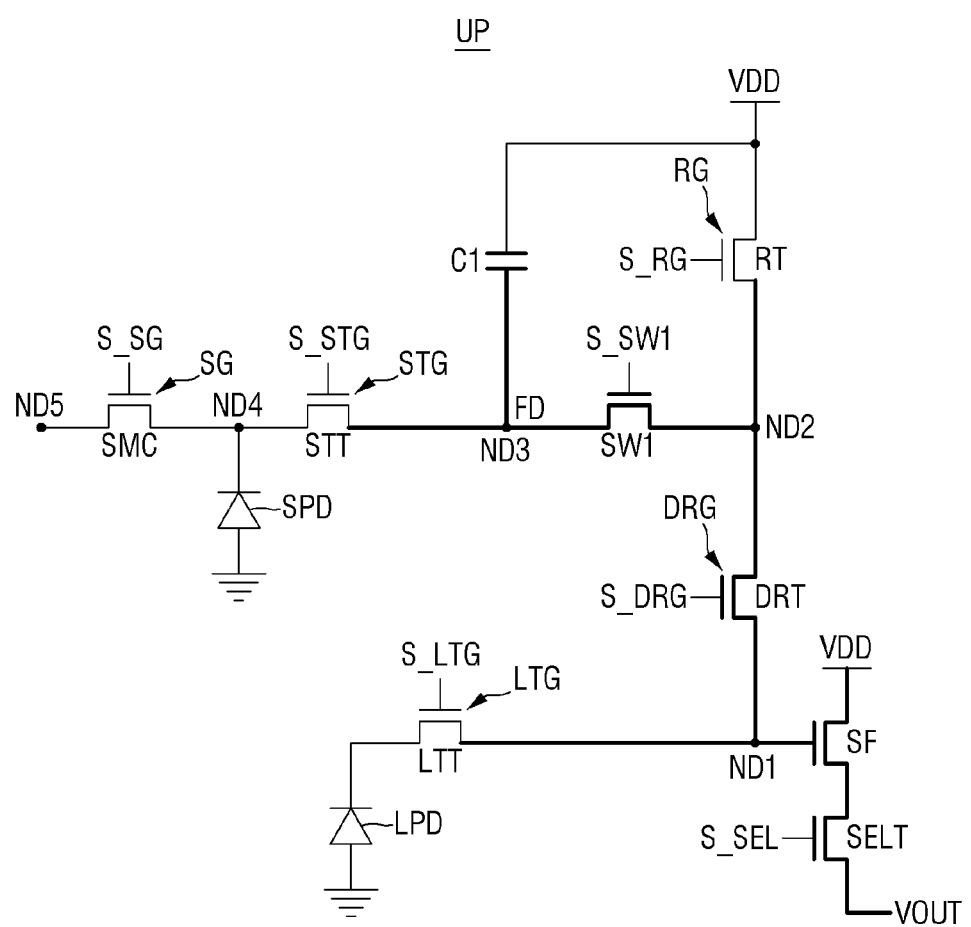

Referring to FIG. 4, FIG. 6, and FIG. 10, the unit pixel UP may perform a third signal operation S3 at a fifth time t5. At a time between the fourth time t4 and the fifth time t5, the first switch signal S_SW1 may be pulled-up. That is, the first switch SW1 may be turned on such that the first switch SW1 may connect the second node ND2 to the third node ND3. After the first switch SW1 is turned on, for example at the fifth time t5, the source follower SF may convert the charges accumulated in the first node ND1, the second node ND2, and the third node ND3 to a third signal voltage VS3 and output the third signal voltage VS3. That is, the output voltage VOUT may be the third signal voltage VS3. The floating diffusion node of the unit pixel UP may have a capacitance including capacitances of the first node ND1, the second node ND2, and the third node ND3. That is, the floating diffusion node of the unit pixel UP may have a high capacitance and a high full well capacity at the fifth time t5. In this connection, the charges charged to the first capacitor C1 may be transferred through the third node ND3.

Further, the unit pixel UP may perform a third reset operation R3 at a sixth time t6. The third reset operation R3 may be a pseudo-reset operation in which the small transfer gate signal S_STG is not pulled-up. Between and the fifth time t5 and the sixth time t6, a signal may not be changed. The source follower SF may convert the charges of the first node ND1, the second node ND2 and the third node ND3 into a third reset voltage VR3 and output the third reset voltage VR3.

Referring to FIG. 7, a third operation OP3 may include the third reset operation R3 and the third signal operation S3. The third operation OP3 may have a third minimum illuminance Min3 and a third maximum illuminance Max3. That is, the third operation OP3 may correspond to a third dynamic range DR3 from the third minimum illuminance Min3 to the third maximum illuminance Max3. A signal output for the third operation OP3 may have the third dynamic range DR3. In some embodiments, the third dynamic range DR3 may not overlap the first and second dynamic ranges DR1 and DR2. The third dynamic range DR3 may have the third minimum illuminance Min3 and the third maximum illuminance Max3 higher than the second dynamic range DR2. A signal-to-noise ratio of the third operation OP3 may be greater than the minimum signal-to-noise ratio SNRmin. The unit pixel UP outputs a signal into which the charges charged in the first to third nodes ND1 to ND3 and the first capacitor C1 are converted. Therefore, a capacitance of the floating diffusion node of the unit pixel UP may be large, and the full well capacity thereof may also be large. In this connection, the third dynamic range DR3 may be used for image sensing in a high illuminance environment.

Referring to FIG. 4 and FIG. 6, in some embodiments, the unit pixel UP may perform a fourth reset operation R4 at a seventh time t7. Between the sixth time t6 and the seventh time t7, a signal may not be changed. The source follower SF may convert the charges accumulated in the first node ND1, the second node ND2 and the third node ND3 to a fourth reset voltage VR4 and may output the fourth reset voltage VR4. The fourth reset operation R4 may be a pseudo-reset operation or may be omitted. For example, when the fourth reset operation R4 is omitted, the third reset voltage VR3 generated in the third reset operation R3 may be used.

In other embodiments, for the time period between the sixth time t6 and the seventh time t7, the reset gate signal S_RG may be pulled-up and then pulled-down, as illustrated by the dotted line portion of the reset gate signal S_RG. The time period may be less than a total time period from the sixth time t6 to the seventh time t7. The source follower SF may convert the charges accumulated in the first node ND1, the second node ND2 and the third node ND3 to a fourth reset voltage VR4 and may output the fourth reset voltage VR4. All of the first to third nodes ND1 to ND3 may be reset. Thus, the first capacitor C1 may be reset. Thereafter, the fourth reset voltage VR4 may be output. However, this operation is optional or may not be performed.

Figure 11:
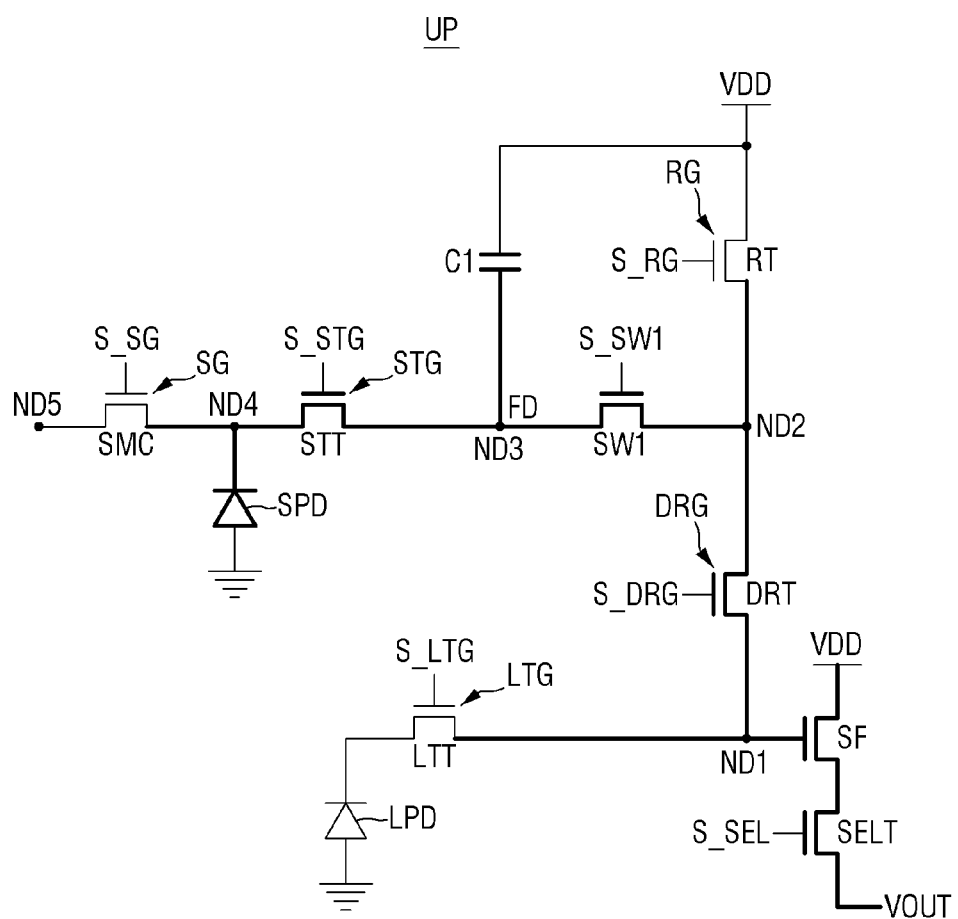
Figure 12:
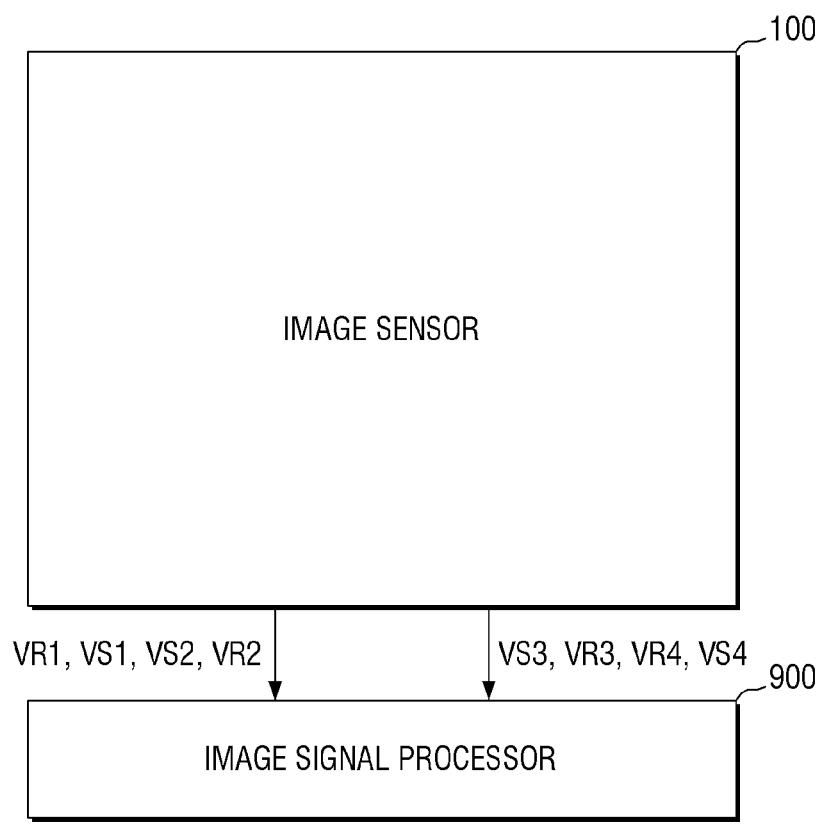
FIG. 12 is a diagram for illustrating a voltage output from the image sensor.

Referring to FIG. 6 and FIG. 11, the unit pixel UP may perform a fourth signal operation S4 at an eighth time t8. For a time period between the seventh time t7 and the eighth time t8, the small transfer gate signal S_STG may be pulled-up and then pulled-down. Further, the storage gate signal S_SG which has been maintained in a pulled-up state may be pulled-down and then may be pulled-up for the time period between the seventh time t7 and the eighth time t8. The time periods may be less than a total time period from the seventh time t7 to the eighth time t8. In the fourth signal operation S4, the charges stored in the storage gate SG until the seventh time t7 may be discharged in the duration from the seventh time t7 to the eighth time t8. For example, the charges stored in the storage MOS capacitor SMC and the charges stored in the small photodiode SPD may be transferred via the first node ND1, the second node ND2, the third node ND3, and the fourth node ND4. In this connection, the small transfer transistor STT may connect the fourth node ND4 and the third node ND3 to each other. That is, the unit pixel UP may output a fourth signal voltage VS4 into which the charges accumulated in the first to fourth nodes ND1 to ND4, the small photodiode SPD, and the storage gate SG are converted. That is, the output voltage VOUT may be the fourth signal voltage VS4. In this connection, the third node ND3 may correspond to a floating diffusion node FD, and a capacitance of the floating diffusion node of the unit pixel UP may be relatively large. Accordingly, the full well capacity thereof may also be large.

For a time period between the eighth time t8 and a ninth time t9, the reset gate signal S_RG may be pulled-up and then pulled-down such that all of the first to fourth nodes ND1 to ND4 may be reset. The time period may be less than a total time period from the eighth time t8 to the ninth time t9. The first switch signal S_SW1 may be maintained in a pulled-up state. After the ninth time t9, the first switch signal S_SW1 may be pulled-down.

Referring to FIG. 7, in some embodiments, a fourth operation OP4 may include the fourth reset operation R4 and the fourth signal operation S4. The fourth operation OP4 may have a fourth minimum illuminance Min4 and a fourth maximum illuminance Max4. That is, the fourth operation OP4 may correspond to a fourth dynamic range DR4 from the fourth minimum illuminance Min4 to the fourth maximum illuminance Max4. A signal output for the fourth operation OP4 may have the fourth dynamic range DR4.

The third operation OP3 and the fourth operation OP4 may correspond to an operation of the small photodiode SPD. The small photodiode SPD is less sensitive comparted to the large photodiode LPD, and thus may react with a large amount of light. The third operation OP3 and the fourth operation OP4 may have the third dynamic range DR3 and the fourth dynamic range DR4, respectively, because the small photodiode SPD reacts with the large amount of light for the third operation OP3 and the fourth operation OP4.

When the storage MOS capacitor SMC is not connected to the fourth node ND4, a maximum illuminance of the unit pixel UP may correspond to the fourth maximum illuminance Max4. When the storage MOS capacitor SMC according to embodiments are connected to the fourth node ND4, the maximum illuminance of the unit pixel UP may correspond to an increased fourth maximum illuminance Max4'. That is, the unit pixel UP includes the storage MOS capacitor SMC, and the storage MOS capacitor SMC stores therein the charges from the small photodiode SPD, so that the full well capacity of the unit pixel UP may increase. Accordingly, the fourth dynamic range DR4 may increase. Further, a portion of the fourth dynamic range DR4 in which a signal-to-noise ratio exceeds the minimum signal-to-noise ratio SNRmin increases, such that an image quality may be improved.

In summary, even when the small photodiode SPD is disposed in the second area REG2 having a small area size, the full well capacity may increase and the image quality may be improved as the storage MOS capacitor SMC is connected to the small photodiode SPD. Further, referring to FIG. 7, the unit pixel UP may output a signal having a full dynamic range FDR including the first to fourth dynamic ranges DR1 to DR4. Therefore, the image sensor 100 may output an image with improved quality in both the low illuminance and high illuminance environments.

Hereinafter, the image sensor 100 according to some further embodiments will be described with reference to FIG. 13.

Figure 13:
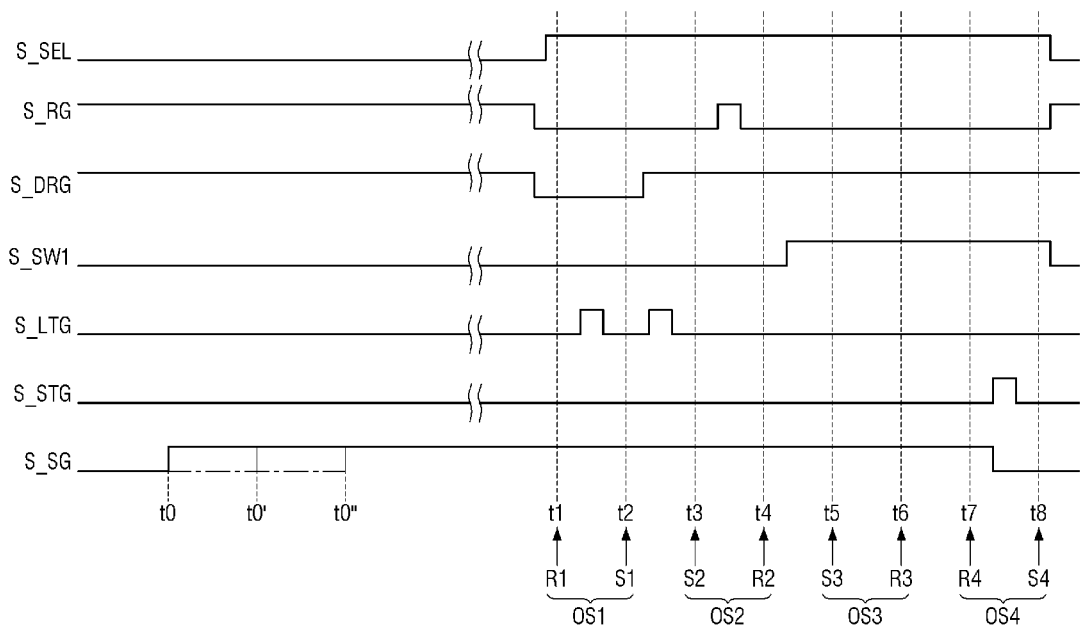
FIG. 13 is an example of a timing diagram for illustrating a method of operating a unit pixel according to some embodiments.

FIG. 13 is a timing diagram for illustrating a method of operating a unit pixel according to some embodiments. For convenience of description, descriptions duplicate with those as described above using FIGS. 1 to 12 are briefly set forth or omitted for conciseness.

Referring to FIG. 4 and FIG. 13, the storage gate signal S_SG to be applied to the storage gate SG may be pulled-down when the small transfer gate signal S_STG is pulled-up. That is, when the charges of the fourth node ND4 are transferred to the third node ND3 via the small transfer transistor STT, the charges stored in the storage gate SG may also be transferred to the third node ND3.

In some embodiments, the storage gate signal S_SG to be applied to the storage gate SG may be pulled-up before the first time t1. That is, a storage time duration of the charges when the storage gate signal S_SG is pulled-up at a first time t0 may be greater than a storage time duration of the charges when the storage gate signal S_SG is pulled-up at a second time t0' or a third time t0". In this case, a storage amount of charges when the storage gate signal S_SG is pulled-up at the first time t0 may be greater than a storage amount of charges when the storage gate signal S_SG is pulled-up at the second time t0'. The storage amount of the charges when the storage gate signal S_SG is pulled-up at the second time t0' may be greater than a storage amount of the charges when the storage gate signal S_SG is pulled-up at the third time t0". That is, the amount of charges stored in the storage gate SG may be changed based on a timing of when the storage gate signal S_SG is pulled up, and specifically how long before the first time t1 the storage gate signal S_SG is pulled up.

Hereinafter, a unit pixel UP_1 according to some embodiments will be described with reference to FIG. 14 and FIG. 15A to FIG. 15C.

Figure 14:
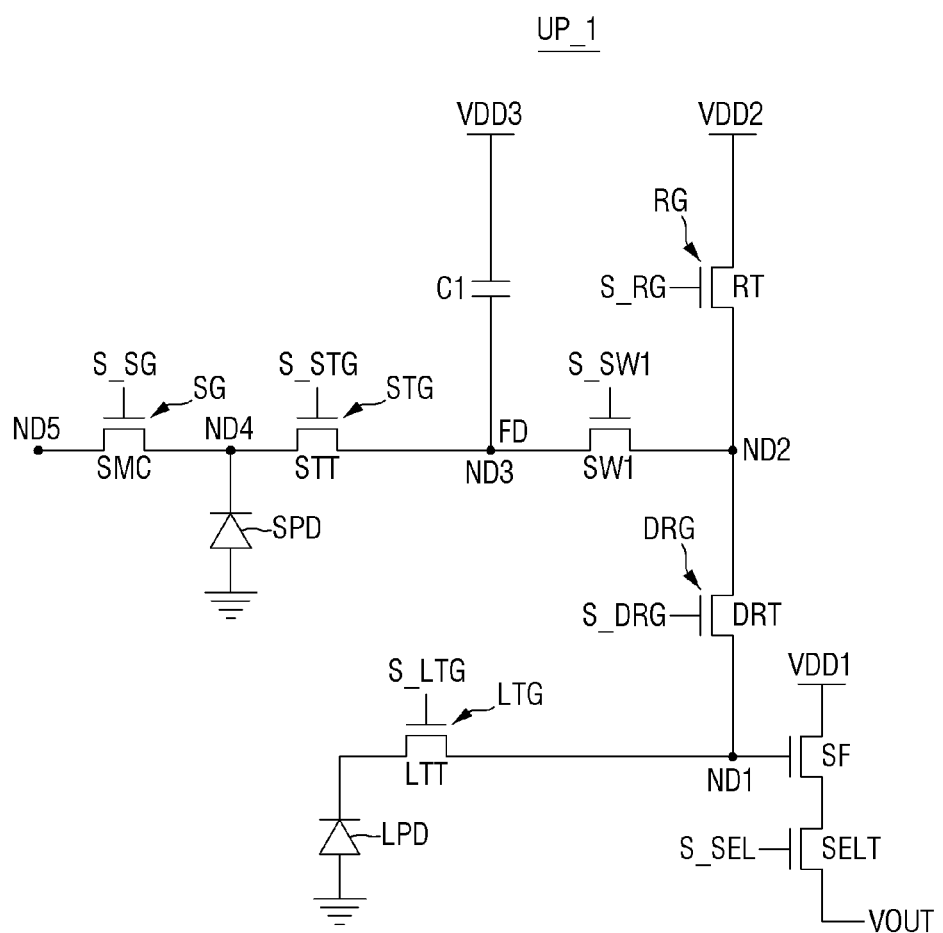
FIG. 14 is a circuit diagram of a unit pixel according to some embodiments.
Figure 15A:
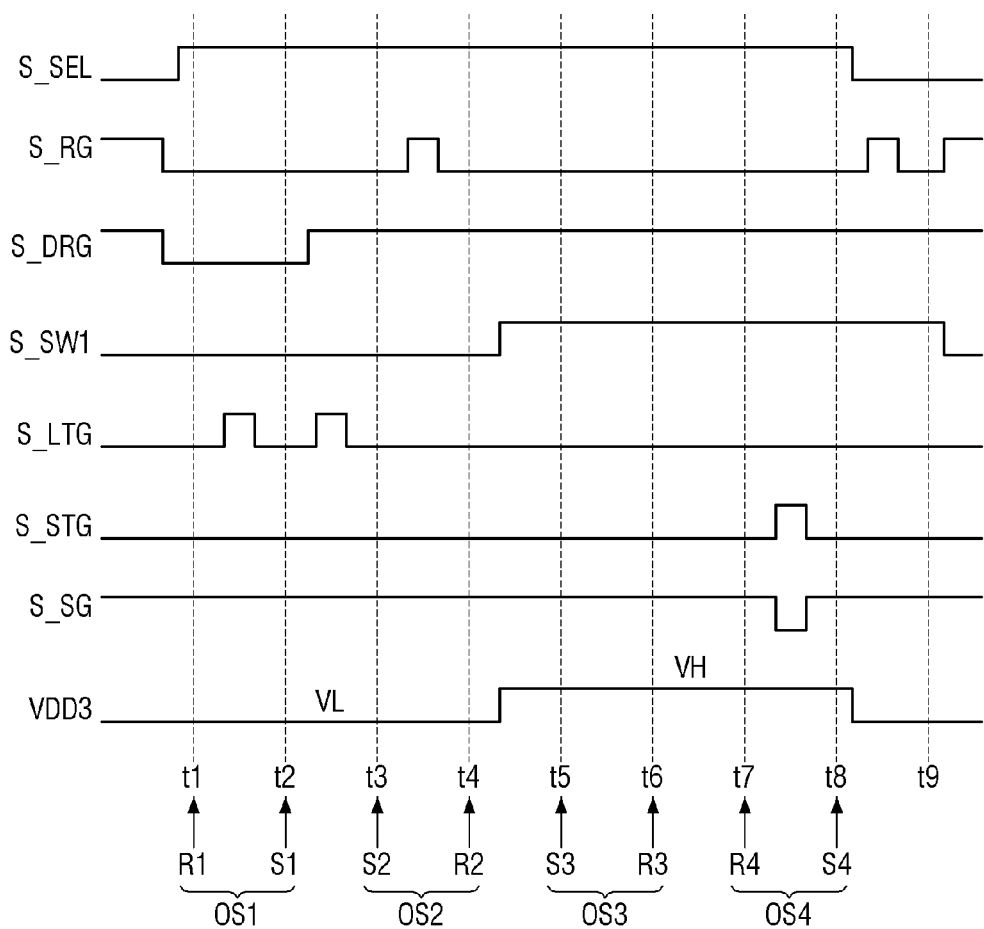
FIG. 15A is an example of a timing diagram for illustrating a method of operating the unit pixel of FIG. 14.
Figure 15B:
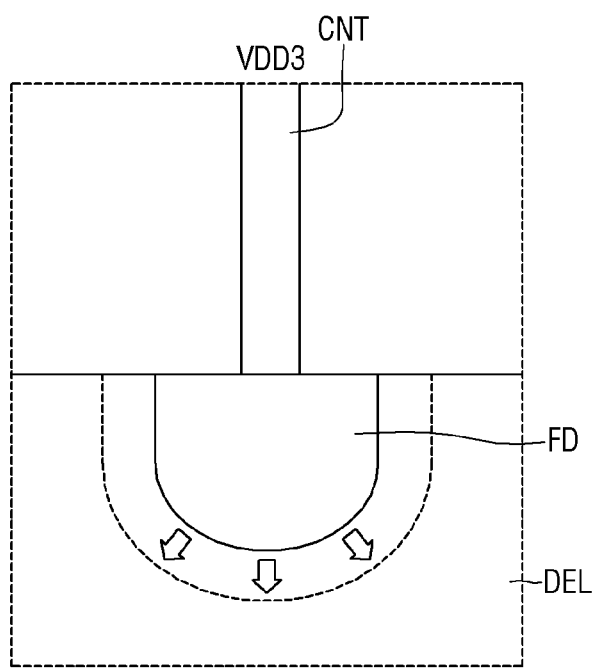
FIG. 15B and FIG. 15C are diagrams for illustrating the unit pixel of FIG. 14 upon receiving a third voltage.
Figure 15C:
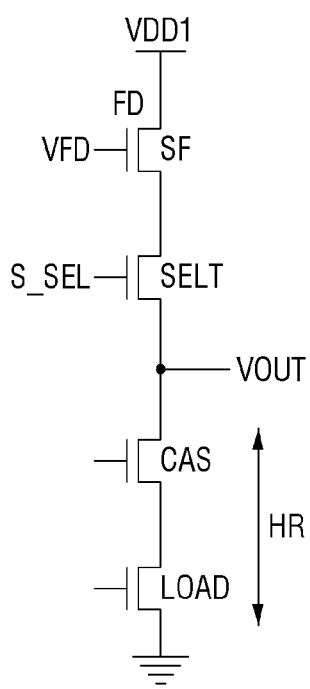

FIG. 14 is a circuit diagram of a unit pixel according to some embodiments. FIG. 15A is a timing diagram for illustrating a method of operating the unit pixel of FIG. 14, according to some embodiments. FIG. 15B and FIG. 15C are diagrams for illustrating the unit pixel of FIG. 14 upon receiving a third voltage. For convenience of description, descriptions duplicate with those as described above using FIGS. 1 to 12 are briefly set forth or omitted for conciseness.

Referring to FIG. 14, the unit pixel UP_1 may receive different power voltages. For example, the source follower SF may receive a first voltage VDD1, the reset transistor RT may receive a second voltage VDD2, and the first capacitor C1 may receive a third voltage VDD3. The unit pixel UP_1 may sense an image using the different power voltages. For example, the first voltage VDD1 and the second voltage VDD2 may have the same voltage level, while the third voltage VDD3 may have a different voltage level from the voltage level of the first and second voltages VDD1 and VDD2. However, embodiments are not limited thereto.

Referring to FIG. 15A, the third voltage VDD3 may have different voltage levels over time. For a time period between the first time t1 and the fourth time t4, the third voltage VDD3 may have a low voltage level VL. For a time period between the fifth time t5 and the eighth time t8, the third voltage VDD3 may have a high voltage level VH. The high voltage level VH may be greater than the low voltage level VL. For example, the high voltage level VH may be about 2.8V, while the low voltage level VL may be about 1.8V. The first capacitor C1 may receive the third voltage VDD3 having the low voltage level VL while a first output signal OS1 and a second output signal OS2 are output. While a third output signal OS3 and a fourth output signal OS4 are output, the first capacitor C1 may receive the third voltage VDD3 having the high voltage level VH. Accordingly, noise generated by the unit pixel UP_1 may be further reduced, and a quality of an image output from the unit pixel UP_1 may be improved.

Referring to FIG. 15B, the floating diffusion node FD may be disposed in the insulating layer DEL, and the floating diffusion node FD may be connected to a contact CNT. The contact CNT may receive the third voltage VDD3. When the third voltage VDD3 to be applied to the contact CNT is at a high level, current leaking from the floating diffusion node FD may increase. That is, the third voltage VDD3 has the low voltage level VL for a time period of the first to fourth times t1 to t4, such that the leakage current from the floating diffusion node FD may be reduced.

Referring to FIG. 15C, the floating diffusion node FD may be connected to a gate of the source follower SF. Further, the source follower SF may be connected to the select transistor SELT, a CAS transistor CAS and a load transistor LOAD. In this configuration, a voltage difference between an output voltage VOUT and a ground voltage may correspond to a headroom HR. When the third voltage VDD3 to be applied to the floating diffusion node FD is at a low level, the floating diffusion node voltage VFD may decrease. Accordingly, the output voltage VOUT may decrease. That is, as the headroom HR decreases, noise may increase. That is, the noise may be reduced when the third voltage VDD3 has a high voltage level VH for a time period of the fifth to eighth times t5 to t8.

Hereinafter, unit pixels UP_2 and UP_2' according to some further embodiments will be described with reference to FIG. 16A, FIG. 16B and FIG. 17.

Figure 16A:
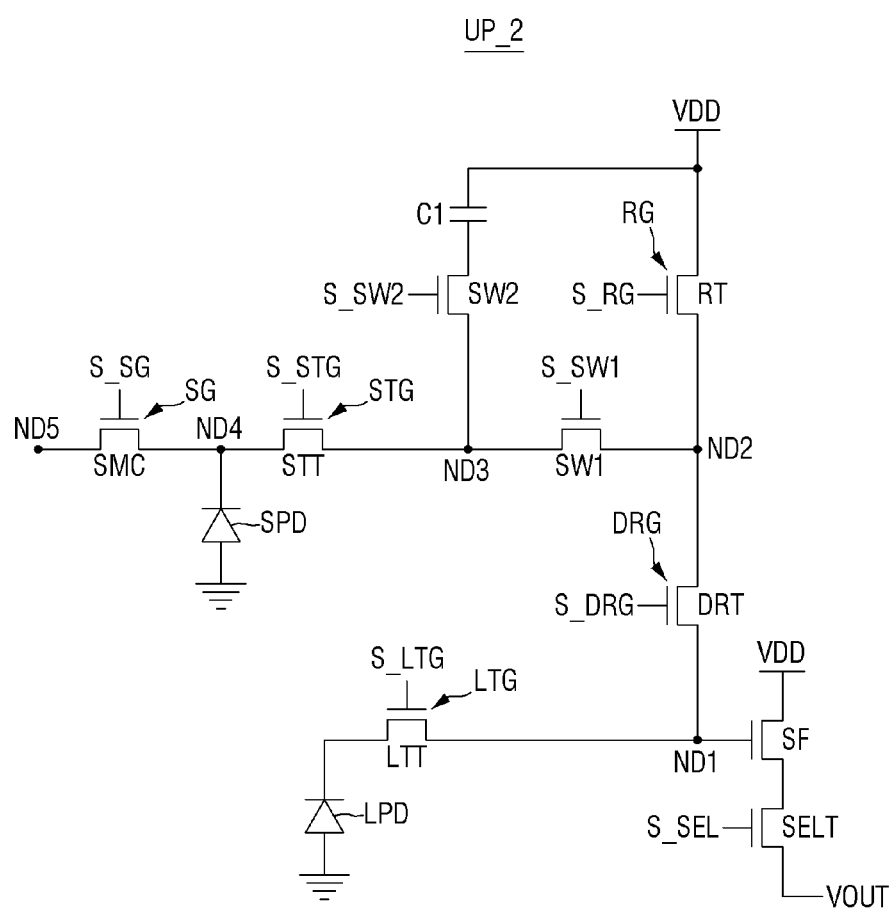
FIG. 16A is a circuit diagram of a unit pixel according to some embodiments.

FIG. 16A is a circuit diagram of a unit pixel according to some embodiments. FIG. 16B is a timing diagram for illustrating a method of operating the unit pixel of FIG. 16A. FIG. 17 is a circuit diagram of a unit pixel according to some embodiments. For convenience of description, descriptions duplicate with those as described above using FIGS. 1 to 15A are briefly set forth or omitted for conciseness.

Figure 16B:
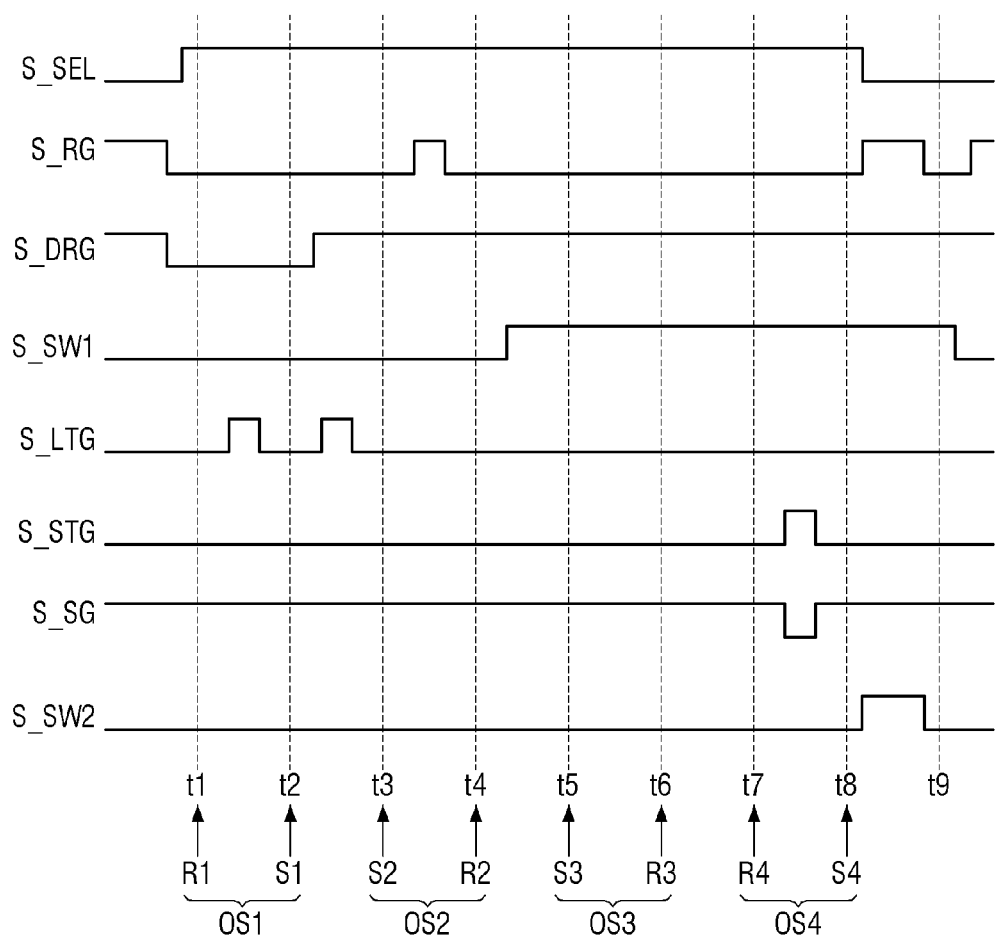
FIG. 16B is a timing diagram for illustrating a method of operating the unit pixel of FIG. 16A, according to some embodiments.

Referring to FIG. 16A and FIG. 16B, the unit pixel UP_2 may include a second switch SW2 disposed between and connected to the first capacitor C1 and the third node ND3. A second switch signal S_SW2 may be applied to a gate of the second switch SW2. As the second switch signal S_SW2 is applied to the gate of the second switch SW2, the first capacitor C1 and the third node ND3 may be connected to each other.

When the second switch SW2 is turned off, the first capacitor C1 is not connected to the third node ND3, and thus, a capacitance of the floating diffusion node of the unit pixel UP_2 may be reduced. Accordingly, the full well capacity of the unit pixel UP_2 may be smaller. Accordingly, the unit pixel UP_2 may operate in a high conversion gain (HCG) state. However, when the second switch SW2 is turned on for the time period between the eighth time t8 to the ninth time t9, the first capacitor C1 may be connected to the third node ND3, and thus the capacitance of the floating diffusion node of the unit pixel UP_2 may increase. The time period may be less than a total time period from the eighth time t8 to the ninth time t9. In this configuration, the full well capacity of the unit pixel UP_2 may be larger. Accordingly, the unit pixel UP_2 may operate in a low conversion gain (LCG) state. That is, due the presence of the second switch SW2, the unit pixel UP_2 may be controlled to operate in different modes. However, embodiments are not limited thereto.

Figure 17:
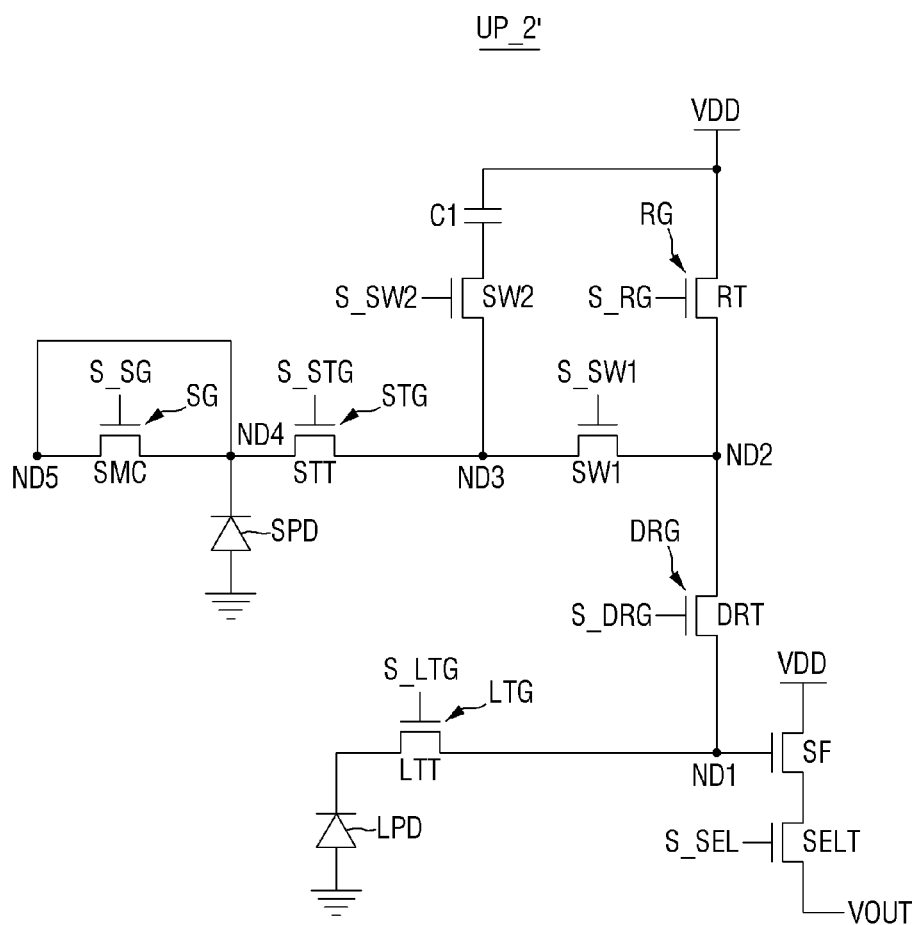
FIG. 17 is a circuit diagram of a unit pixel according to some embodiments.

Referring to FIG. 17, in the unit pixel UP_2', the fourth node ND4 may be connected to the fifth node ND5. For example, both a substrate SUB corresponding to the fourth node ND4 and a substrate SUB corresponding to the fifth node ND5 may be doped with P-type dopants. In this configuration, the small photodiode SPD may be disposed between the storage MOS capacitor SMC and the small transfer transistor STT and connected to the storage MOS capacitor SMC and the small transfer transistor STT. The charges from the small photodiode SPD may be transferred to and stored in the storage gate SG. In this configuration, even when the fourth node ND4 and the fifth node ND5 are electrically connected to each other, the storage MOS capacitor SMC may operate normally.

Hereinafter, unit pixels UP_3 and UP_3' according to some further embodiments will be described with reference to FIGS. 18 and 19.

Figure 18:
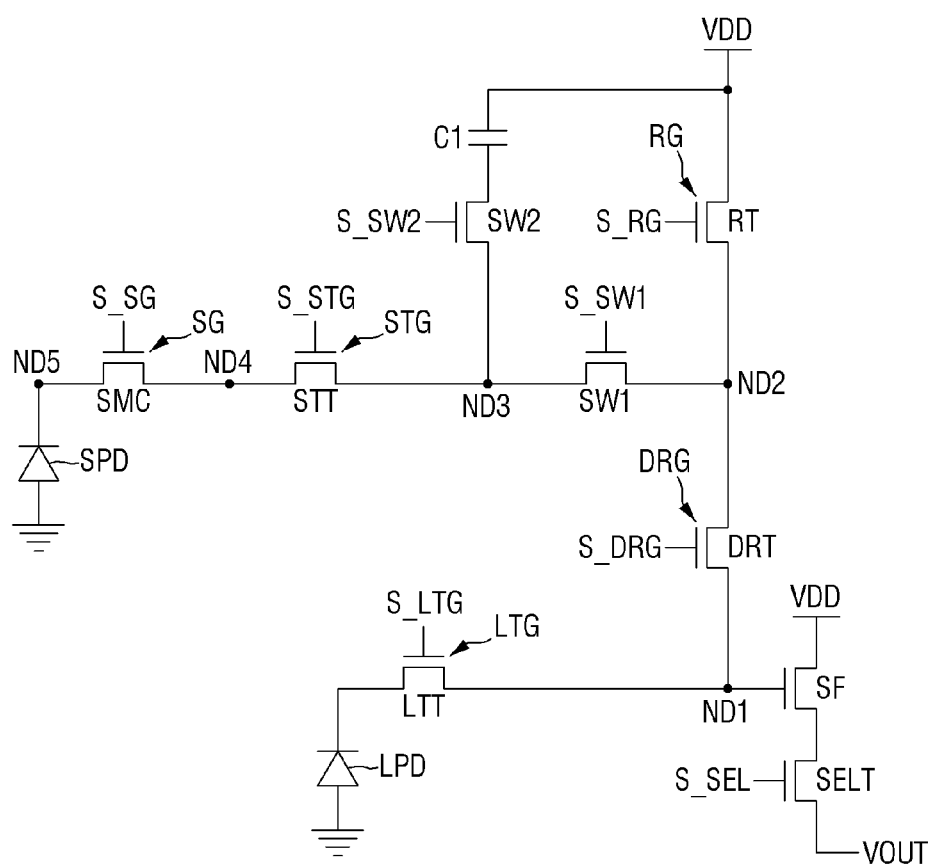
FIG. 18 is a circuit diagram of a unit pixel according to some embodiments.

FIG. 18 is a circuit diagram of a unit pixel according to some embodiments. FIG. 19 is a circuit diagram of a unit pixel according to some embodiments. For convenience of description, descriptions duplicate with those as described above using FIGS. 1 to 17 are briefly set forth or omitted for conciseness.

Referring to FIG. 18, in the unit pixel UP_3, one end of the small photodiode SPD may be connected to the fifth node ND5. That is, the small photodiode SPD may be connected to the storage MOS capacitor SMC via the fifth node ND5. The small photodiode SPD may be connected to the small transfer transistor STT via the storage MOS capacitor SMC.

The storage MOS capacitor SMC may store therein charges from the small photodiode SPD. Further, the charges stored in the small photodiode SPD and the storage gate SG may be transferred, through the small transfer transistor STT, to the third node ND3. That is, the unit pixel UP_3 may include the storage MOS capacitor SMC disposed between the small photodiode SPD and the small transfer transistor STT and connected to the small photodiode SPD and the small transfer transistor STT and thus may store therein the charges.

Figure 19:
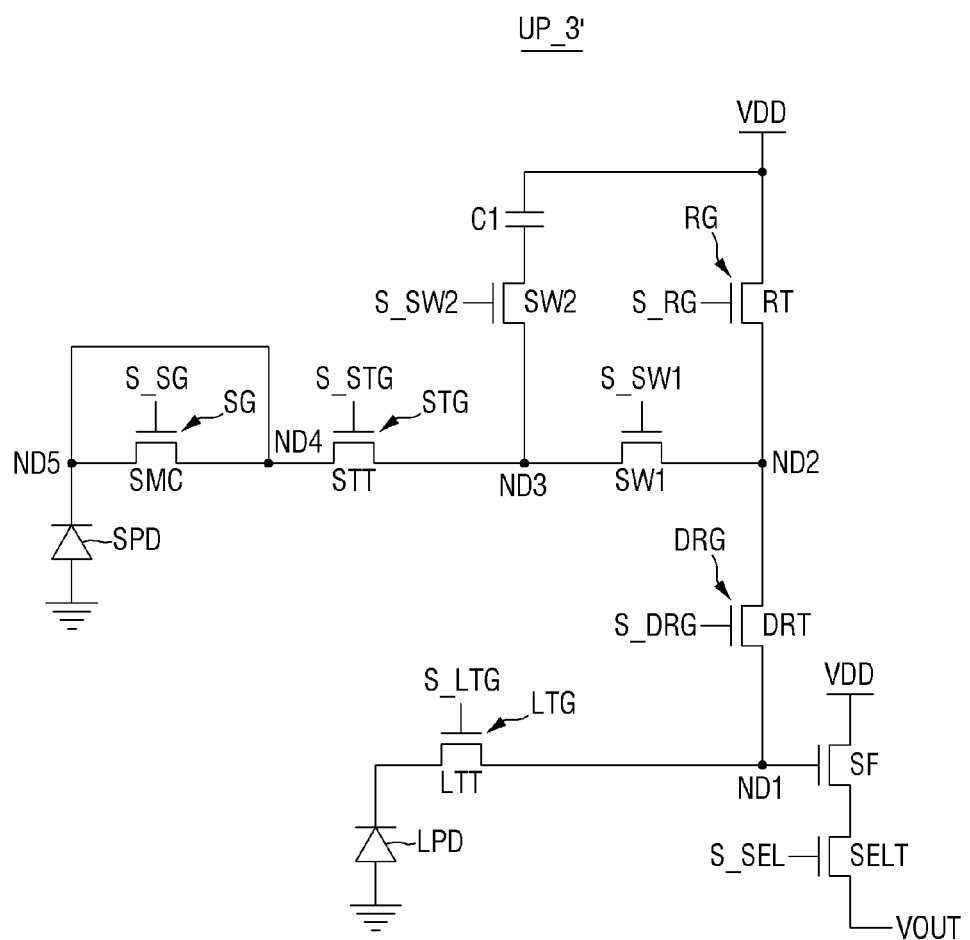
FIG. 19 is a circuit diagram of a unit pixel according to some embodiments.

Referring to FIG. 19, in the unit pixel UP_3, the fourth node ND4 and the fifth node ND5 may be connected to each other. That is, the charges stored in the small photodiode SPD and the charges stored in the storage gate SG may be accumulated in both the fourth node ND4 and the fifth node ND5. The accumulated charges may be transferred to the third node ND3 via the small transfer transistor STT.

Hereinafter, unit pixels UP_4 and UP_4' according to some further embodiments will be described with reference to FIG. 20 and FIG. 21.

Figure 20:
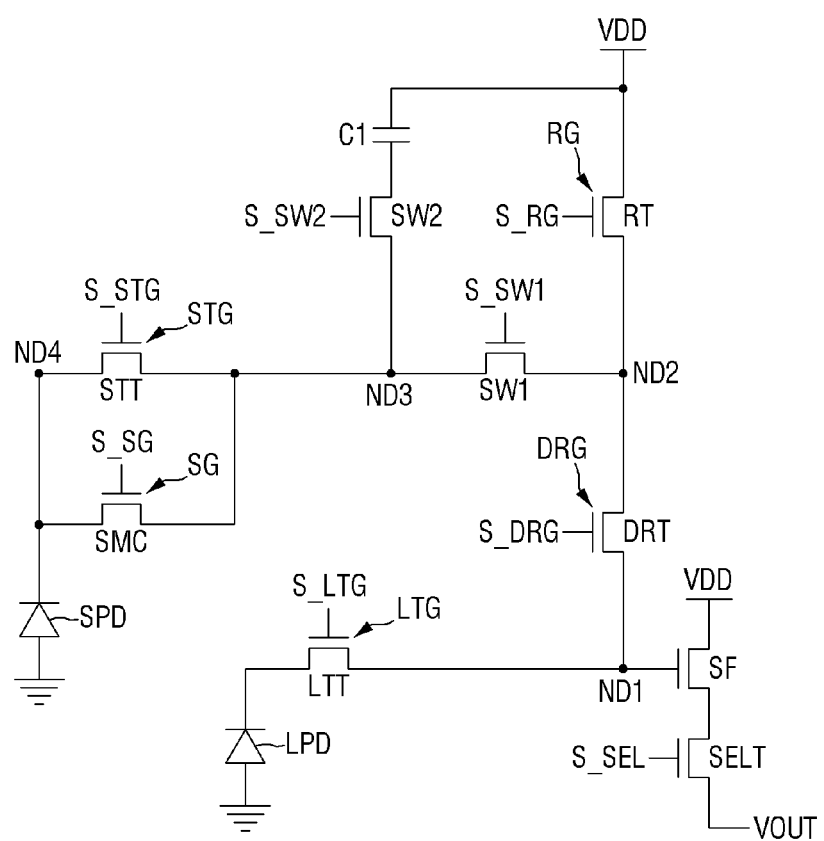
FIG. 20 is a circuit diagram of a unit pixel according to some embodiments.

FIG. 20 is a circuit diagram of a unit pixel according to some embodiments. FIG. 21 is a circuit diagram of a unit pixel according to some embodiments. For convenience of description, descriptions duplicate with those as described above using FIGS. 1 to 17 are briefly set forth or omitted for conciseness.

Referring to FIG. 20, in the unit pixel UP_4, the small transfer transistor STT and the storage MOS capacitor SMC may be connected to each other in a parallel manner. That is, the small transfer transistor STT may be connected in parallel with the storage MOS capacitor SMC. For example, the small transfer transistor STT may be connected to the third node ND3 and the fourth node ND4. The storage MOS capacitor SMC may be connected to the third node ND3 and the fourth node ND4. Further, the small photodiode SPD may be connected to the fourth node ND4.

The storage MOS capacitor SMC may store therein the charges from the small photodiode SPD. The charges accumulated in the fourth node ND4 and the storage gate SG may be transferred to the third node ND3 when the small transfer transistor STT is turned on.

Figure 21:
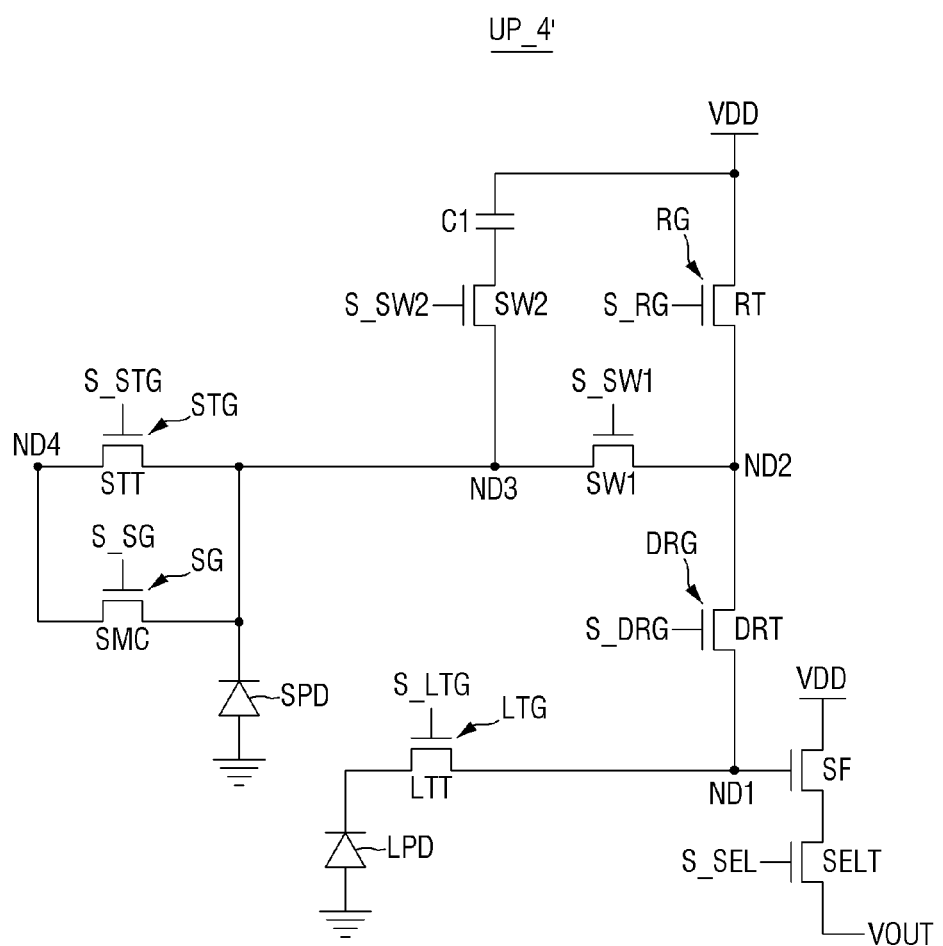
FIG. 21 is a circuit diagram of a unit pixel according to some embodiments.

Referring to FIG. 21, in the unit pixel UP_4', the small photodiode SPD may be connected to the third node ND3. In this configuration, the charges from the small photodiode SPD may be accumulated in the third node ND3. Further, the storage gate SG may store therein the charges from the small photodiode SPD. Accordingly, the full well capacity of the unit pixel UP_4' may be increased and thus the image quality may be improved.

Hereinafter, a unit pixel UP_5 according to some further embodiments will be described with reference to FIG. 22.

Figure 22:
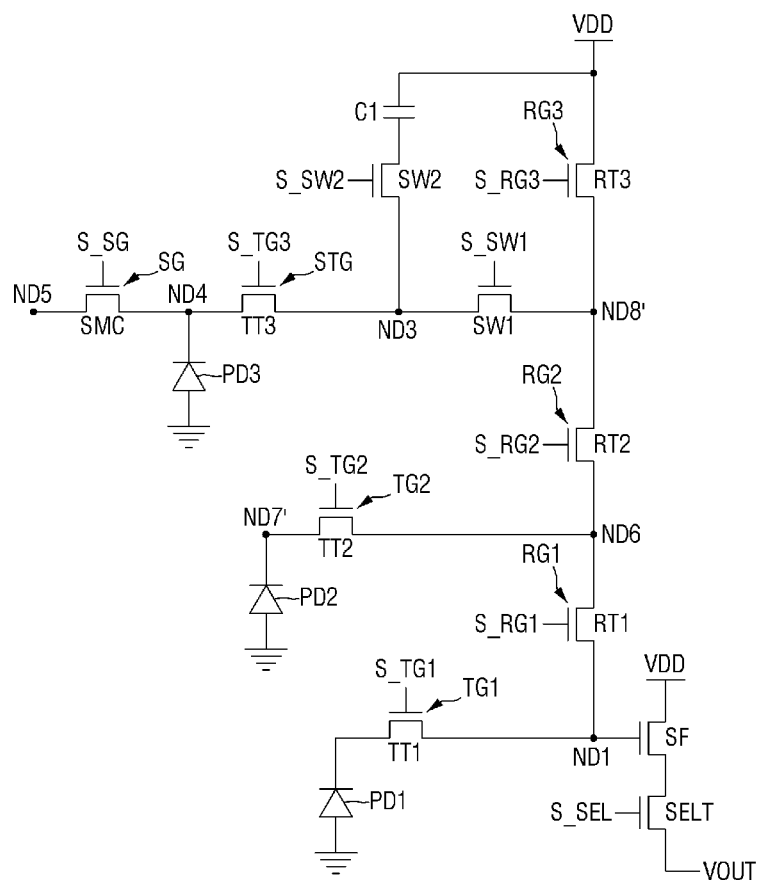
FIG. 22 is a circuit diagram of a unit pixel according to some embodiments.

FIG. 22 is a circuit diagram of a unit pixel according to some embodiments. For convenience of description, descriptions duplicate with those as described above using FIGS. 1 to 17 are briefly set forth or omitted for conciseness.

Referring to FIG. 22, the unit pixel UP_5 may include a first photodiode PD1, a first transfer transistor TT1, a first reset transistor RT1, a second photodiode PD2, a second transfer transistor TT2, a second reset transistor RT2, a first switch SW1, a second switch SW2, a third reset transistor RT3, a first capacitor C1, a third photodiode PD3, a third transfer transistor TT3 and a storage MOS capacitor SMC.

The charges into which the first photodiode PD1 converts received light may be transferred to a first node ND1 via the first transfer transistor TT1, and then the charges may be output as an output voltage VOUT. As the first reset transistor RT1 is turned on, the charges into which the second photodiode PD2 converts received light may be transferred from a seventh node ND7' to a sixth node ND6 via the second transfer transistor TT2, and then the charges may be output as the output voltage VOUT. As the second reset transistor RT2 is turned on, the charges into which the third photodiode PD3 converts received light and the charges accumulated in a storage gate SG may be transferred to an eighth node ND8' via the third transfer transistor TT3, and then, the charges may be output as the output voltage VOUT.

However, embodiments are not limited thereto. For example, in some embodiments, the unit pixel UP_5 may include more than three photodiodes. In such a configuration, the storage MOS capacitor SMC may be connected to one end of at least one of the plurality of photodiodes.

Hereinafter, a unit pixel UP according to some further embodiments will be described with reference to FIG. 23 and FIG. 24.

Figure 23:
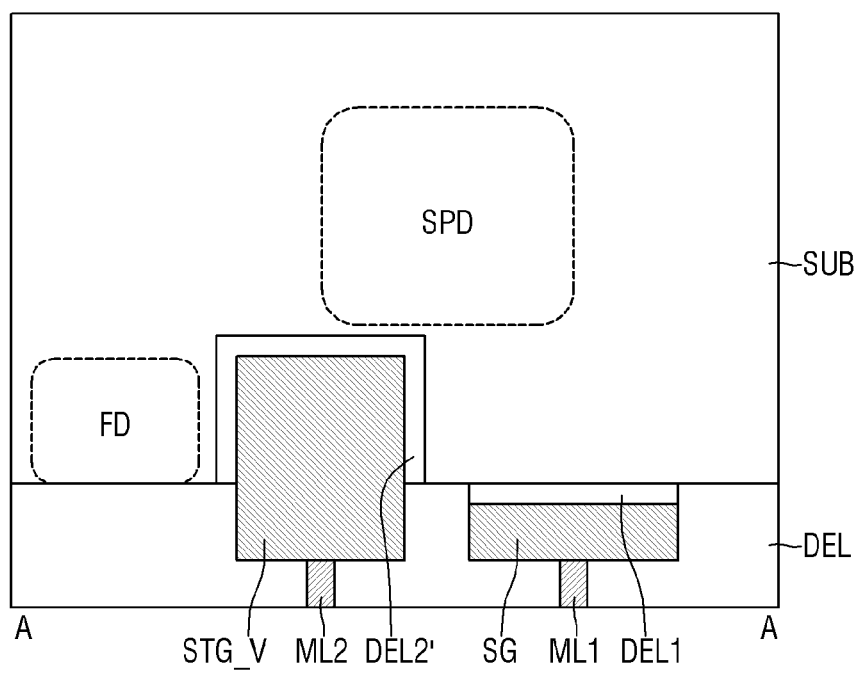
FIG. 23 is a cross-sectional view of a unit pixel according to some embodiments.

FIG. 23 is a cross-sectional view of a unit pixel according to some embodiments. FIG. 24 is a cross-sectional view of a unit pixel according to some embodiments. For convenience of description, descriptions duplicate with those as described above using FIGS. 1 to 17 are briefly set forth or omitted for conciseness.

Referring to FIG. 23, the unit pixel UP may include a vertical small transfer gate STG_V and a second insulating layer DEL2'. In this configuration, the second insulating layer DEL2' may be formed along a trench defined in the substrate SUB. That is, the second insulating layer DEL2' may be formed at a boundary between the vertical small transfer gate STG_V and the substrate SUB. The vertical small transfer gate STG_V may be formed in both the substrate SUB and the insulating layer DEL. That is, the vertical small transfer gate STG_V may be formed in a trench defined in the second insulating layer DEL2'. In this configuration, vertical small transfer gate STG_V may be closer to the small photodiode SPD.

Figure 24:
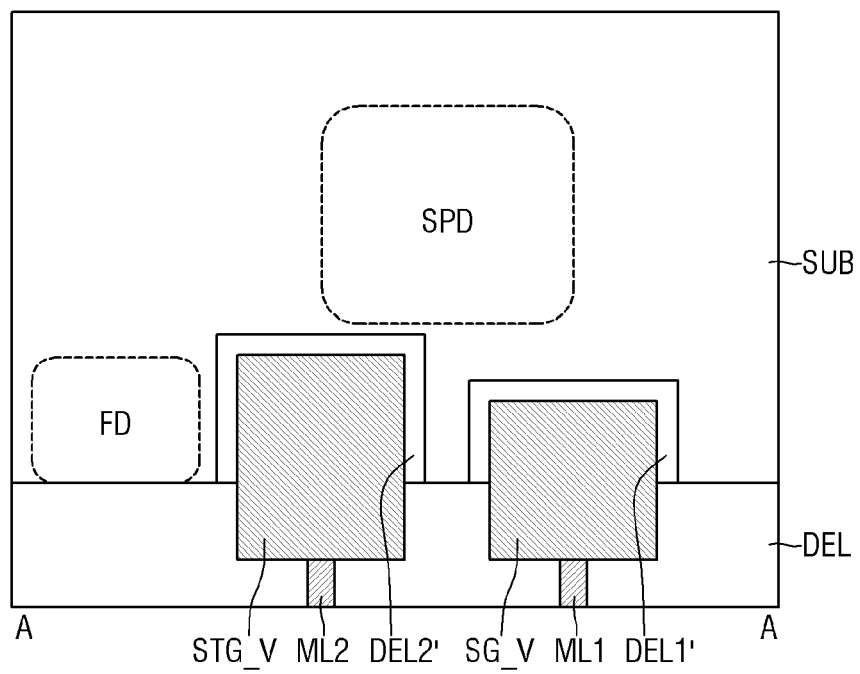
FIG. 24 is a cross-sectional view of a unit pixel according to some embodiments.

Referring to FIG. 24, the unit pixel UP may include a vertical storage gate SG_V and a first insulating layer DEL1'. The first insulating layer DEL1' may be formed along a trench defined in the substrate SUB. The first insulating layer DEL1' may be formed at a boundary between the substrate SUB and the vertical storage gate SG_V. The vertical storage gate SG_V may be formed in both the substrate SUB and the insulating layer DEL. That is, the vertical storage gate SG_V may be formed in a trench defined in the first insulating layer DEL1'. The vertical storage gate SG_V may be adjacent to the small photodiode SPD. The vertical storage gate SG_V may effectively store therein the charges from the small photodiode SPD.

Hereinafter, a unit pixel UP' according to some further embodiments will be described with reference to FIG. 25 to FIG. 28. For convenience of description, descriptions duplicate with those as described above using FIGS. 1 to 24 are briefly set forth or omitted for conciseness.

Figure 25:
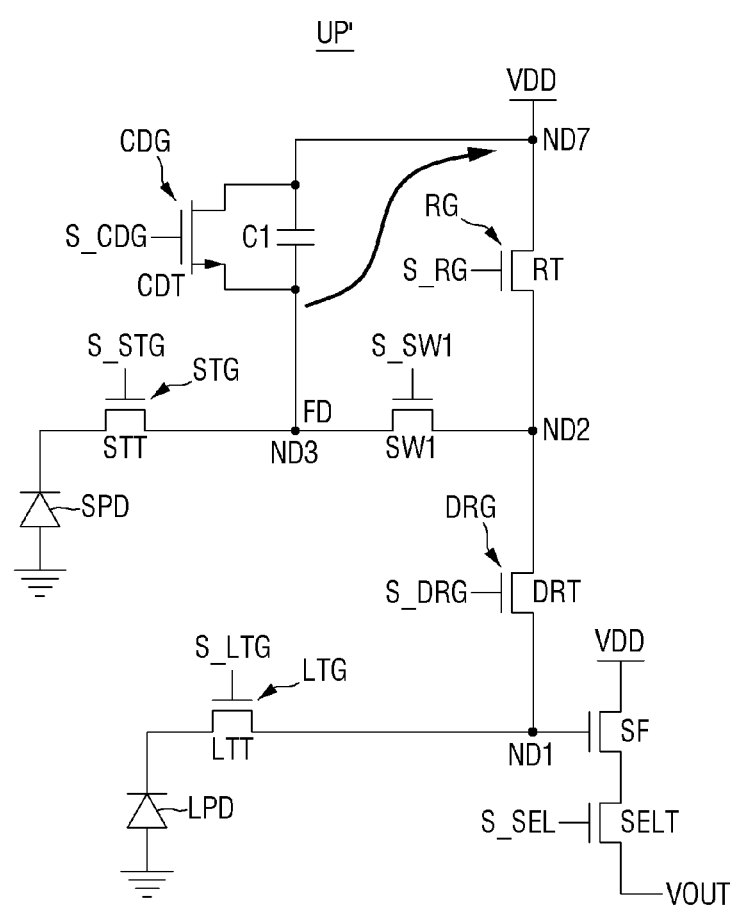
FIG. 25 is a circuit diagram of a unit pixel according to some embodiments.

FIG. 25 is a circuit diagram of a unit pixel according to some embodiments.

Referring to FIG. 25, the unit pixel UP' may include a large photodiode LPD, a large transfer transistor LTT, a source follower SF, a select transistor SELT, a connection transistor DRT, a reset transistor RT, a first switch SW1, a first capacitor C1, a small photodiode SPD, a small transfer transistor STT, and a capacitor discharge transistor CDT. In this configuration, the large photodiode LPD, the large transfer transistor LTT, the source follower SF, the select transistor SELT, the connection transistor DRT, the reset transistor RT, the first switch SW1, the first capacitor C1, the small photodiode SPD, and the small transfer transistor STT may correspond to those of the unit pixel UP as described using FIG. 1 to FIG. 24 and thus a repeated description thereof is omitted for conciseness.

The capacitor discharge transistor CDT may be disposed between the third node ND3 and a seventh node ND7 and connected to the third node ND3 and the seventh node ND7. In some embodiments, the seventh node ND7 may be connected to the power voltage VDD and the reset transistor RT. The third node ND3 may correspond to the floating diffusion node FD, and may be connected to the first switch SW1 and the small transfer transistor STT. The capacitor discharge transistor CDT may be connected to the first capacitor C1 in a parallel manner. That is, the capacitor discharge transistor CDT may be connected in parallel with the first capacitor C1. That is, the capacitor discharge transistor CDT may be connected to both ends of the first capacitor C1. Ends of the capacitor discharge transistor CDT may be respectively connected to the third node ND3 and the seventh node ND7 respectively corresponding to ends of the first capacitor C1.

The capacitor discharge transistor CDT may include a capacitor discharge gate CDG to which a capacitor discharge gate signal S_CDG is applied. The capacitor discharge gate signal S_CDG may control the capacitor discharge transistor CDT to discharge the first capacitor C1. When the capacitor discharge gate signal S_CDG is pulled-up to operate the capacitor discharge transistor CDT, the capacitor discharge transistor CDT may connect the third node ND3 and the seventh node ND7 to each other. Accordingly, a voltage difference across the first capacitor C1 may be 0V. That is, the charges charged in the first capacitor C1 may be discharged to the seventh node ND7. Due to the presence of the capacitor discharge transistor CDT, the charges stored in the first capacitor C1 may be rapidly discharged. This ability to rapidly discharge charges may reduce a time duration to discharge the first capacitor C1. Accordingly, the unit pixel UP' may be realized in which the image quality may be improved, and an operation speed may be improved.

Figure 26:
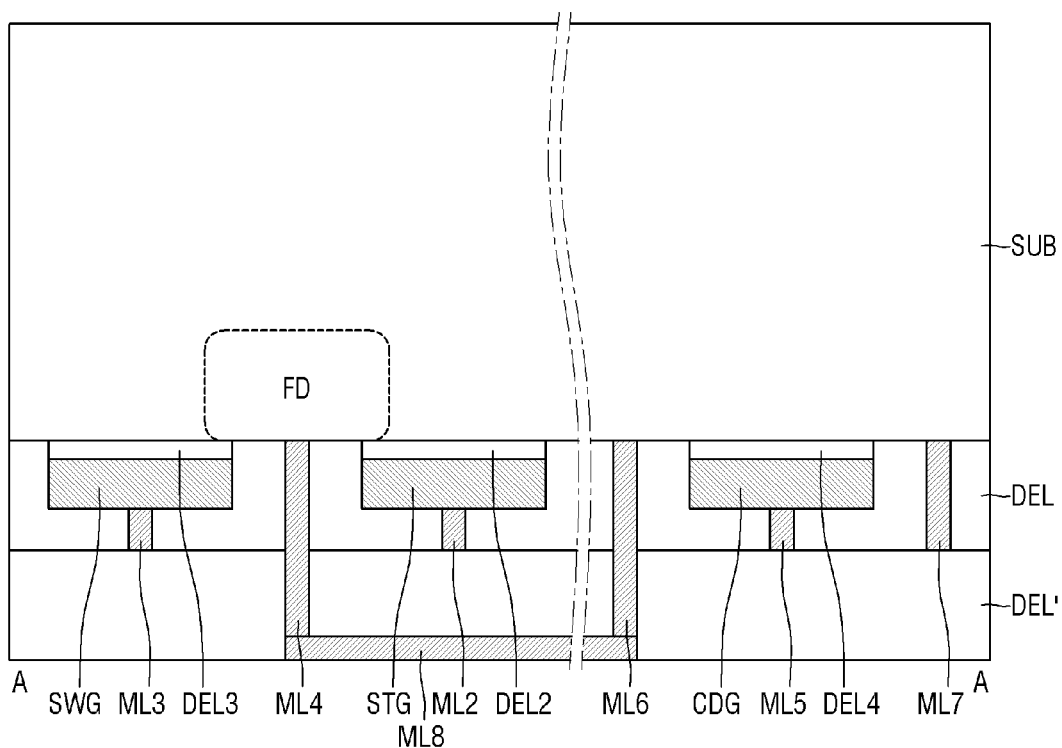
FIG. 26 is a cross-sectional view of the unit pixel of FIG. 25.

FIG. 26 is a cross-sectional view of the unit pixel of FIG. 25.

Referring to FIG. 26, the unit pixel UP' may include a second insulating layer DEL2, a small transfer gate STG, a second metal layer ML2, a third insulating layer DEL3, a switch gate SWG, a third metal layer ML3, a fourth metal layer ML4, a fourth insulating layer DEL4, a capacitor discharge gate CDG, a fifth metal layer ML5, a sixth metal layer ML6, a seventh metal layer ML7, and an eighth metal layer ML8. In some embodiments, the switch gate SWG may correspond to a gate of the first switch SW1.

The floating diffusion node FD may be connected to the capacitor discharge transistor CDT via the fourth metal layer ML4. That is, the fourth metal layer ML4 may be connected to one end of the capacitor discharge transistor CDT via the sixth metal layer ML6. The fourth metal layer ML4 and the sixth metal layer ML6 may be electrically connected to each other via the eighth metal layer ML8. The eighth metal layer ML8 may be disposed in the insulating layer DEL'. Further, the seventh metal layer ML7 may be connected to the power voltage VDD. The sixth metal layer ML6 and the seventh metal layer ML7 may be respectively connected to ends of the first capacitor C1. Accordingly, the first capacitor C1 and the capacitor discharge transistor CDT may be connected to each other in a parallel manner.

Figure 27:
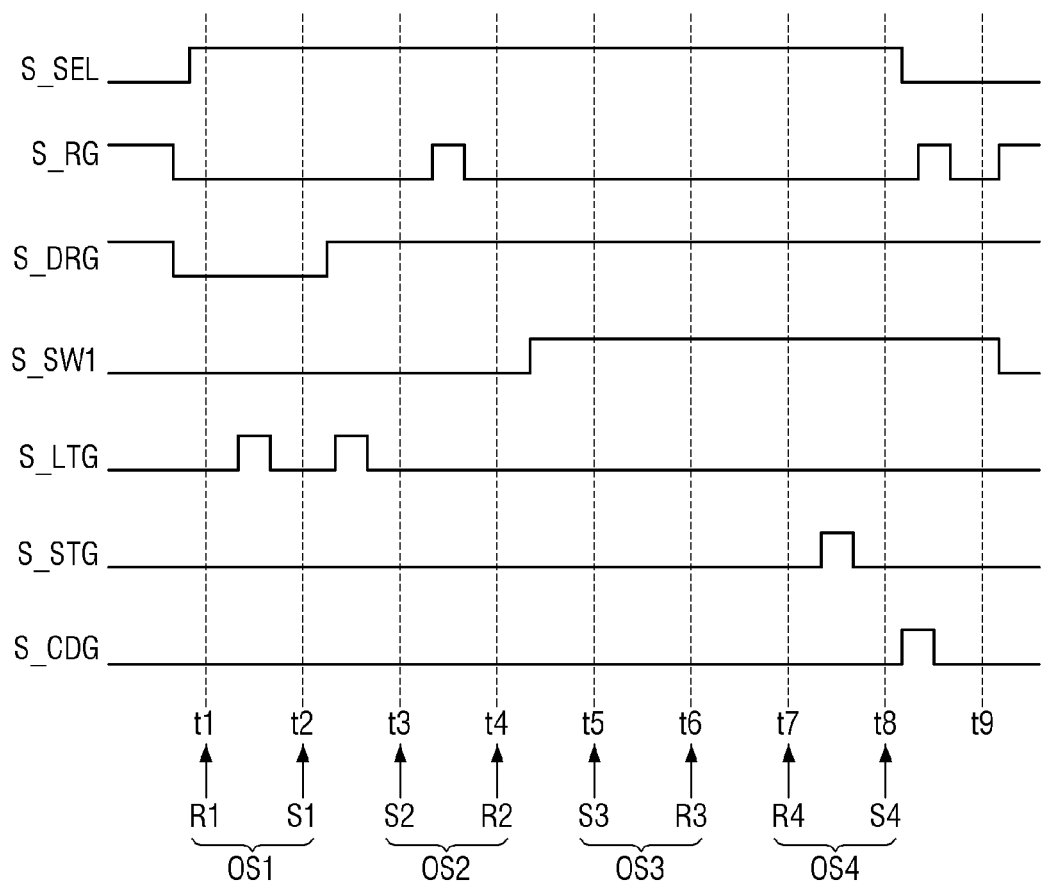
FIG. 27 is an example of a timing diagram for illustrating a method of operating the unit pixel of FIG. 25.
Figure 28:
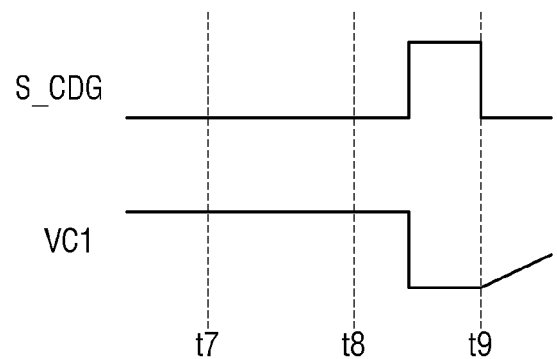
FIG. 28 is a diagram for illustrating discharging of a first capacitor of the unit pixel in FIG. 25.

FIG. 27 is a timing diagram for illustrating a method of operating the unit pixel of FIG. 25. FIG. 28 is a diagram for illustrating discharging of the first capacitor in FIG. 25.

Referring to FIG. 25 and FIG. 27, the small transfer gate signal S_STG may be pulled-up for a time period between the seventh time t7 and the eighth time t8. The time period may be less that a total time period from the seventh time t7 to the eighth time t8. The accumulated charges from the small photodiode SPD may be transferred to the third node ND3. Thereafter, the small transfer gate signal S_STG, the first switch signal S_SW1, and the selection signal S_SEL may be pulled-down, and the reset gate signal S_RG may be pulled-up. As the reset gate signal S_RG is pulled-up, the first capacitor C1 may be reset. That is, charges overflowing from the small photodiode SPD and stored in the first capacitor C1 may be discharged therefrom. The overflowing charges stored in the first capacitor C1 may have overflowed from the small photodiode SPD for a time period before the eighth time t8. For example, when the small photodiode SPD is fully filled with the charges, the charges may overflow from the small photodiode SPD. The overflowing charges may move through a barrier and then be continuously transferred to the first capacitor C1 and stored therein.

The capacitor discharge gate signal S_CDG may be pulled-up. That is, the capacitor discharge gate signal S_CDG may be pulled-up after the eighth time t8. Thus, the capacitor discharge transistor CDT may operate. The first capacitor C1 may be discharged for a short time duration.

Referring to FIG. 28, when the capacitor discharge gate signal S_CDG is pulled-up, a first capacitor voltage VC1 across the first capacitor C1 may become 0V for a short time duration. That is, as the third node ND3 and the seventh node ND7 are connected to each other, a potential difference across the first capacitor voltage VC1 may become 0V.

Thereafter, the capacitor discharge gate signal S_CDG may be pulled-down at the ninth time t9 subsequent to the eighth time t8. Subsequently, the first capacitor C1 may receive and store therein the charges from the small photodiode SPD. Accordingly, the first capacitor voltage VC1 may increase over time. In the unit pixel UP', as a capacitance of the first capacitor C1 increases, a discharge time duration of the first capacitor C1 may increase. However, according to an embodiment, when the capacitor discharge transistor CDT is turned on, the first capacitor C1 may be discharged within a short time duration. Accordingly, a discharge time duration of the first capacitor C1 may be reduced, and thus, an operation speed of the unit pixel UP' may be increased.

Hereinafter, a unit pixel UP'_2 according to some further embodiments will be described with reference to FIG. 29. For convenience of description, descriptions duplicate with those as described above using FIG. 25 to FIG. 28 are briefly set forth or omitted for conciseness.

Figure 29:
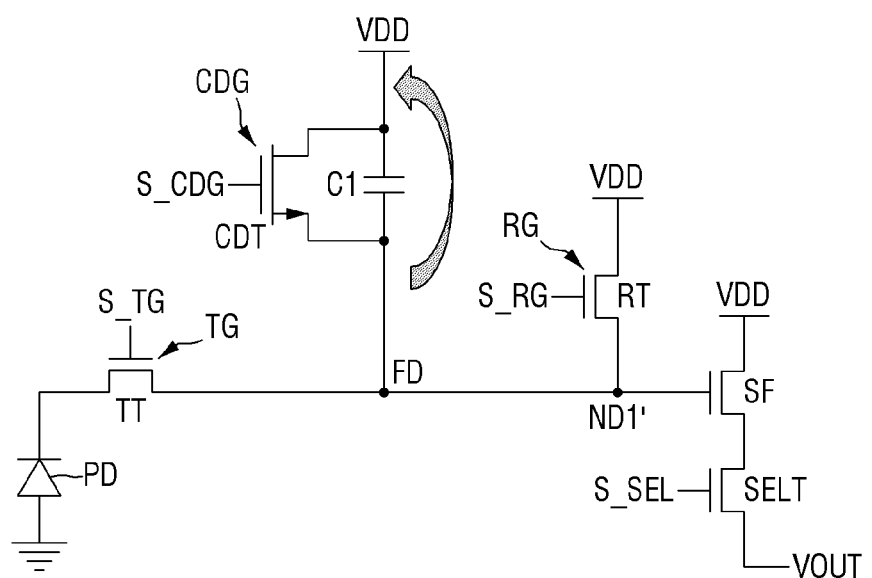
FIG. 29 is a circuit diagram of a unit pixel according to some embodiments.

FIG. 29 is a circuit diagram of a unit pixel according to some embodiments.

Referring to FIG. 29, the unit pixel UP'_2 may include a photodiode PD, a transfer transistor TT, a source follower SF, a select transistor SELT, a reset transistor RT, a first capacitor C1 and a capacitor discharge transistor CDT.

The transfer transistor TT may be disposed between the photodiode PD and a first node ND1' and connected to the photodiode PD and the first node ND1'. A transfer gate signal S_TG may be applied to a transfer gate TG of the transfer transistor TT. The first node ND1' may correspond to the floating diffusion node FD. A gate of the source follower SF may be connected to the first node ND1'. The select transistor SELT may be connected to the source follower SF. The reset transistor RT may be disposed between and connected to the power voltage VDD and the first node ND1'. In this connection, a reset gate signal S_RG may be applied to a reset gate RG.

The first capacitor C1 may be disposed between the first node ND1' and the power voltage VDD and connected to the first node ND1' and the power voltage VDD. The first capacitor C1 may store therein the charges from the photodiode PD. Further, the first capacitor C1 may be connected to the first node ND1' to increase the full well capacity of the unit pixel UP'_2.

The capacitor discharge transistor CDT may be connected to both ends of the first capacitor C1. Further, when a capacitor discharge gate signal S_CDG is applied to the capacitor discharge gate CDG, the first capacitor C1 may be discharged. That is, when the capacitor discharge gate signal S_CDG is turned on, the charges stored in the first capacitor C1 may be discharged for a short time duration. In other words, the unit pixel UP'_2 including one photodiode PD may have a further increased operation speed by rapidly discharging the first capacitor C1 via the capacitor discharge transistor CDT.

Hereinafter, a unit pixel UP'_3 according to some further embodiments will be described with reference to FIG. 30. For convenience of description, descriptions duplicate with those as described above using FIG. 25 to FIG. 28 are briefly set forth or omitted for conciseness.

Figure 30:
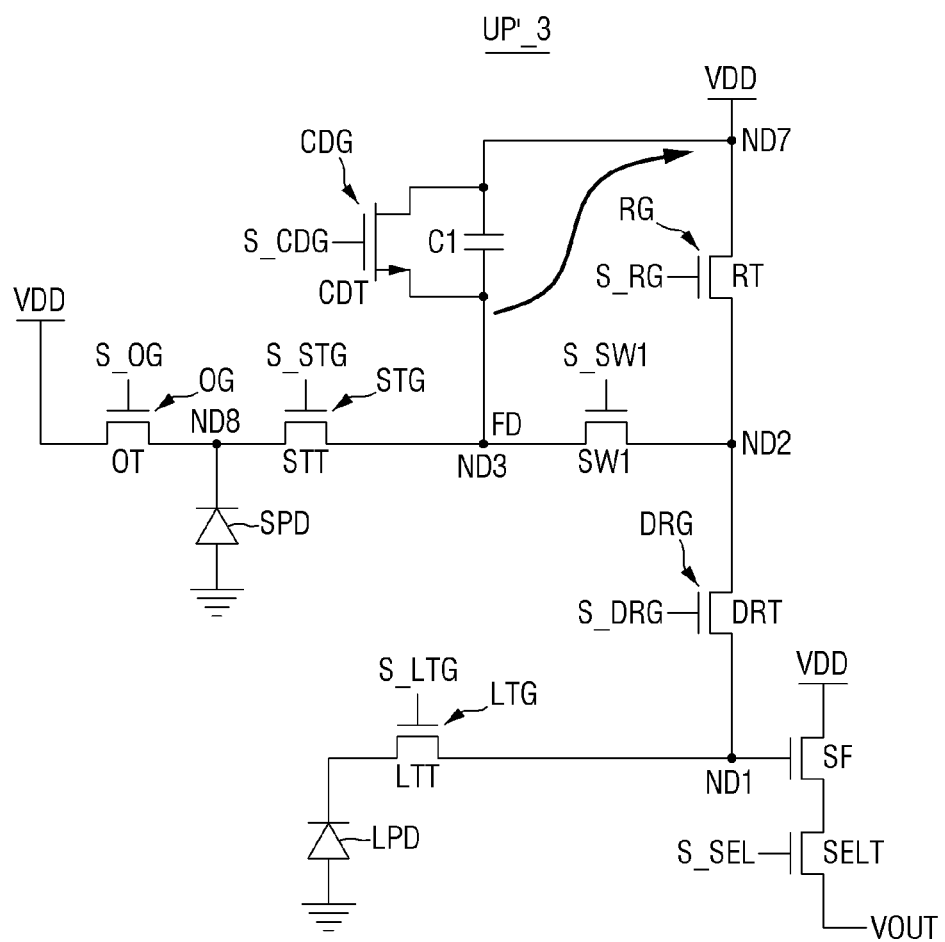
FIG. 30 is a circuit diagram of a unit pixel according to some embodiments.

FIG. 30 is a circuit diagram of a unit pixel according to some embodiments.

Referring to FIG. 30, the unit pixel UP'_3 may include an overflow transistor OT. The overflow transistor OT may be disposed between an eighth node ND8 and the power voltage VDD and connected to the eighth node ND8 and the power voltage VDD. The eighth node ND8 may refer to a node via which the small photodiode SPD and the small transfer transistor STT are connected to each other. The overflow transistor OT may include an overflow gate OG to which an overflow gate signal S_OG is applied. As the overflow gate signal S_OG is applied thereto, the charges overflowing from the small photodiode SPD may be discharged. That is, the overflow transistor OT may discharge the overflowing charges, so that the charges stored in the small photodiode SPD may be kept at a constant amount. However, embodiments are not limited thereto. In some embodiments, the unit pixel UP'_3 may omit the overflow transistor OT.

Hereinafter, a unit pixel UP'_4 according to some further embodiments will be described with reference to FIG. 31. For convenience of description, descriptions duplicate with those as described above using FIG. 25 to FIG. 28 are briefly set forth or omitted for conciseness.

Figure 31:
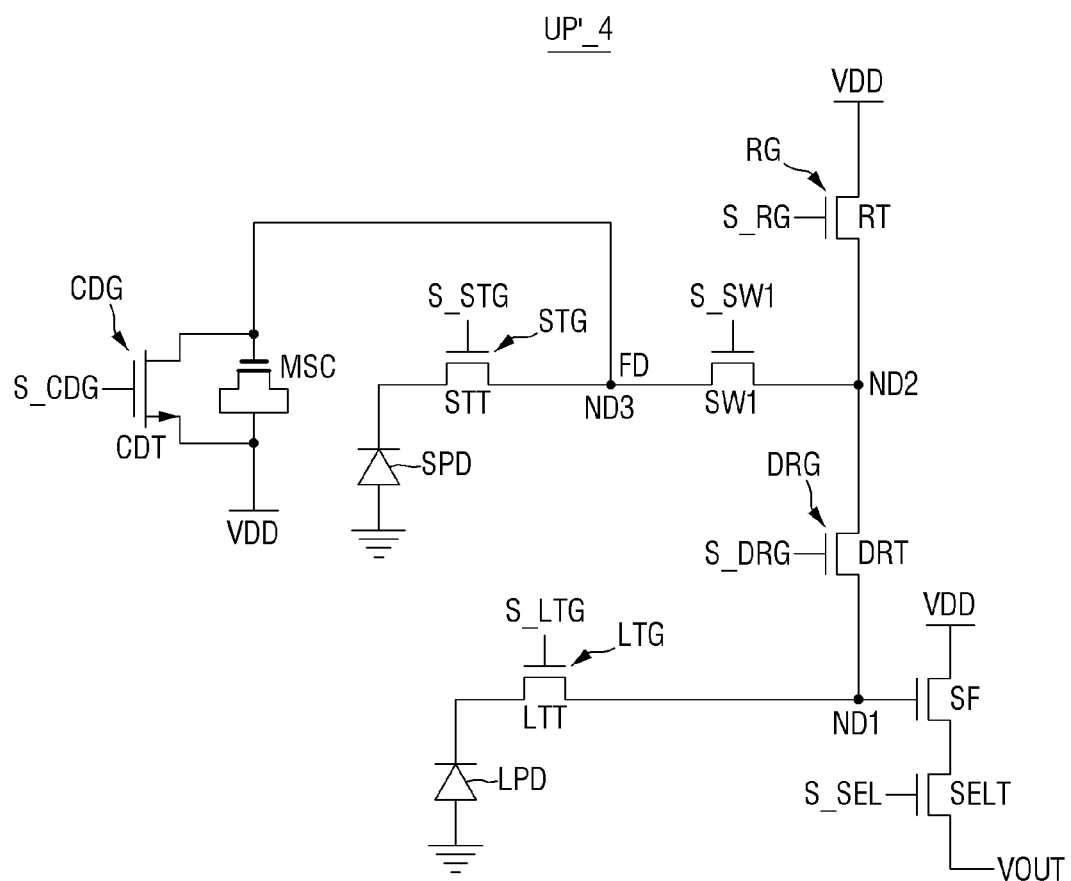
FIG. 31 is a circuit diagram of a unit pixel according to some embodiments.

FIG. 31 is a circuit diagram of a unit pixel according to some embodiments.

Referring to FIG. 31, the unit pixel UP'_4 may include a MOS capacitor MSC. That is, the MOS capacitor MSC may replace the first capacitor C1 as described with reference to FIGS. 25 to 28. The MOS capacitor MSC may be disposed between the third node ND3 and the power voltage VDD and connected to the third node ND3 and the power voltage VDD and may store therein the charges from the small photodiode SPD. Further, the capacitor discharge transistor CDT may be connected to both ends of the MOS capacitor MSC, so that the charges charged in the MOS capacitor MSC may be discharged within a short time duration.

Hereinafter, a unit pixel UP'_5 according to some further embodiments will be described with reference to FIG. 32. For convenience of description, descriptions duplicate with those as described above using FIG. 29 are briefly set forth or omitted for conciseness.

Figure 32:
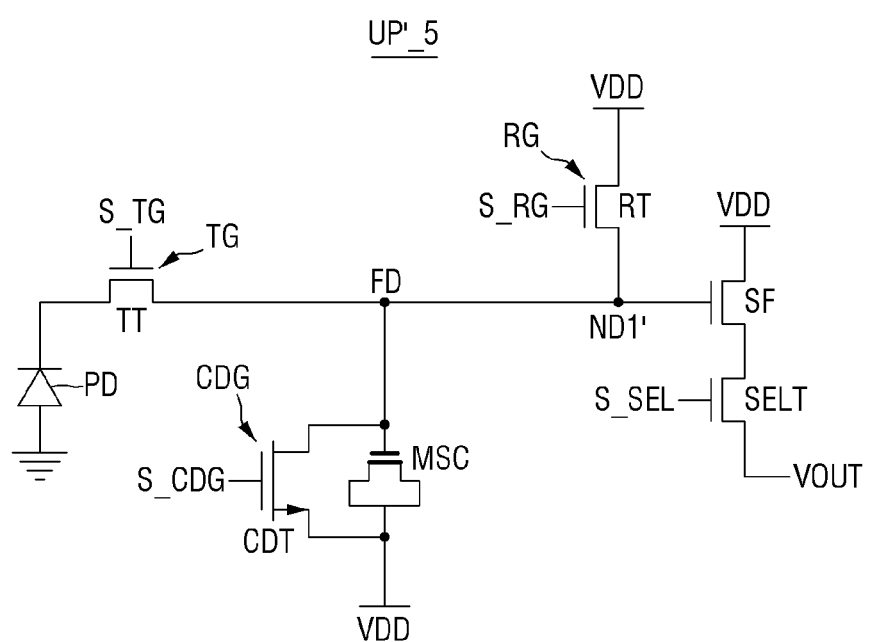
FIG. 32 is a circuit diagram of a unit pixel according to some embodiments.

FIG. 32 is a circuit diagram of a unit pixel according to some embodiments.

Referring to FIG. 32, the unit pixel UP'_5 may include a MOS capacitor MSC. The MOS capacitor MSC may replace the first capacitor C1 as described with reference to FIG. 29. The MOS capacitor MSC may be disposed between the first node ND1' and the power voltage VDD and connected to the first node ND1' and the power voltage VDD and may store therein the charges from the photodiode PD. Further, the capacitor discharge transistor CDT may be connected to both ends of the MOS capacitor MSC, so that the charges charged in the MOS capacitor MSC may be discharged within a short time duration.

Figure 33:
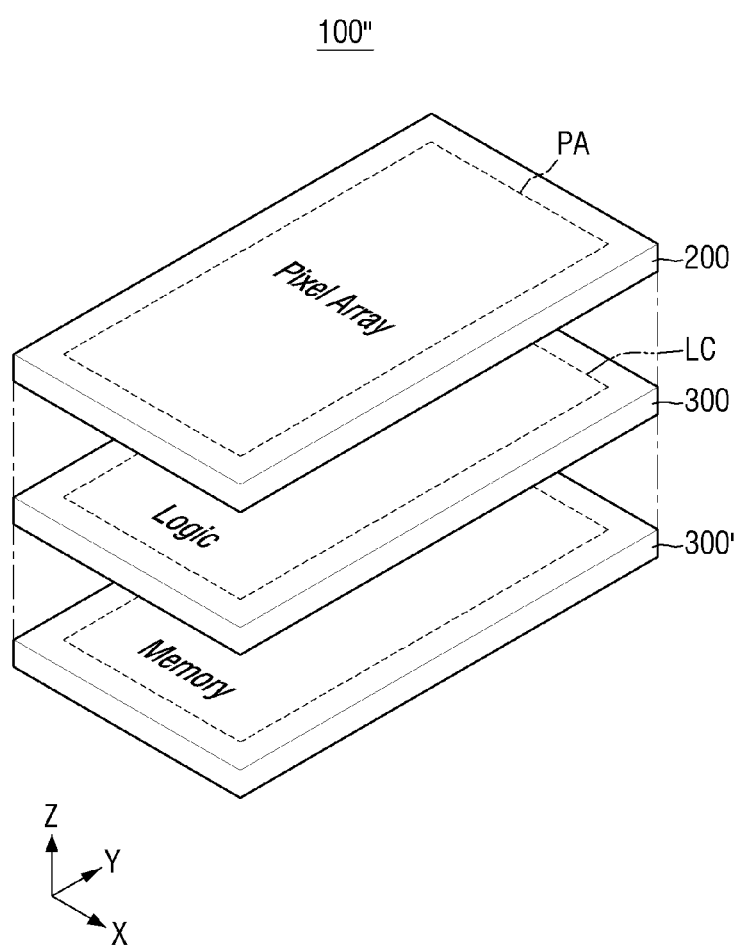
FIG. 33 is a diagram illustrating a conceptual layout of an image sensor according to some embodiments.

FIG. 33 is a diagram illustrating a conceptual layout of an image sensor according to some embodiments.

Referring to FIG. 33, an image sensor 100''' may include an upper chip 200, a lower chip 300, and a memory chip 300'. In some embodiments, the upper chip 200, the lower chip 300, and the memory chip 300' may be sequentially stacked along the third direction Z. The memory chip 300' may be disposed under the lower chip 300. The memory chip 300' may include a memory device. For example, the memory chip 300' may include a volatile memory device such as DRAM or SRAM. The memory chip 300' may receive signals from the upper chip 200 and the lower chip 300 and process the signals using the memory device. That is, the image sensor 100''' including the memory chip 300' may correspond to a three stack image sensor.

Hereinafter, a vehicle 700 including an image sensor 730 according to various embodiments will be described with reference to FIG. 34.

Figure 34:
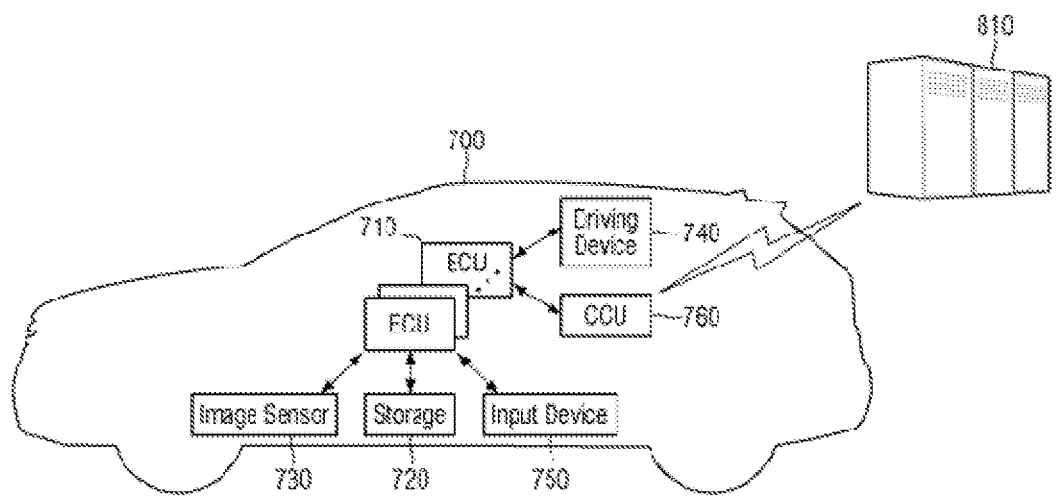
FIG. 34 is a view of a vehicle including an image sensor according to some embodiments.

FIG. 34 is a view of a vehicle including an image sensor according to various embodiments. For convenience of description, descriptions duplicate with those as described above using FIGS. 1 to 33 are briefly set forth or omitted for conciseness.

Referring to FIG. 34, the vehicle 700 may include a plurality of electronic control units (ECUs) 710, and a storage 720.

Each of the plurality of electronic control units 710 may be electrically, mechanically, and communicatively connected to at least one component among a plurality of components disposed in the vehicle 700, and may control an operation of at least one component based on a function execution command.

The plurality of components may include the image sensor 730 that acquires an image used to perform at least one function, and a driving device 740 that performs the at least one function.

For example, the image sensor 730 may include the image sensor 100 as described with reference to FIG. 1 to FIG. 33. That is, the image sensor 730 may correspond to the image sensor 100 including the unit pixel UP. In this configuration, the image sensor 730 may correspond to an automotive image sensor.

The driving device 740 may include a fan and a compressor of an air conditioning device, a fan of a ventilation device, an engine and a motor of a power device, a motor of a steering device, a motor and a valve of a braking device, and an opening/closing device of a door or a tail gate.

The plurality of electronic control units 710 may communicate with the image sensor 730 and the driving device 740 using, for example, at least one of Ethernet, low voltage differential signal (LVDS) communication, and Local Interconnect Network (LIN) communication.

The plurality of electronic control units 710 determines whether it is necessary to perform a function, based on information obtained through the image sensor 730, and then, controls an operation of the driving device 740 that performs the function when it is determined that it is necessary to perform the function. In some embodiments, the plurality of electronic control units 710 may control an operation amount based on the obtained information. The plurality of electronic control units 710 may store the acquired image in the storage 720 or read information stored in the storage 720 and use the read information.

The plurality of electronic control units 710 may control an operation of the driving device 740 that performs the function, based on the function execution command input through an input device 750. The plurality of electronic control units 710 may identify a set amount corresponding to information input through the input unit 750, and may control the operation of the driving device 740 which performs the function, based on the identified set amount Each electronic control unit 710 may independently control one function, or may control one function in conjunction with another electronic control unit of the plurality of electronic control units 710.

For example, an electronic control unit for a collision avoidance device may output a warning sound about a collision with an obstacle through a speaker when a distance of the vehicle to the obstacle as detected using a distance detector is within a reference distance.

An electronic control unit for an autonomous driving control device may be associated with an electronic control unit for a vehicle terminal, an electronic control unit for an image acquisition device, and an electronic control unit for the collision avoidance device and may receive navigation information, road image information, and distance information to the obstacles, and may control the power device, the braking device, and the steering device based on the received information for autonomous driving.

A connectivity control unit (CCU) 760 may be electrically, mechanically and communicatively connected to each of the plurality of electronic control units 710, and may communicate with each of the plurality of electronic control units 710.

That is, the connectivity control device 760 may communicate directly with the plurality of electronic control units 710 provided inside the vehicle, and may communicate with an external server, and may communicate with an external terminal via an interface.

In some embodiments, the connectivity control device 760 may communicate with the plurality of electronic control units 710, and may communicate with a server 810 using an antenna (not shown) and RF communication.

Further, the connectivity control device 760 may communicate with the server 810 through wireless communication. The wireless communication between the connectivity control device 760 and the server 810 may include various wireless communication schemes such as Wifi, wireless broadband, GSM (global System for Mobile Communication), CDMA (Code Division Multiple Access), WCDMA (Wideband Code Division Multiple Access), UMTS (universal mobile telecommunications system), TDMA (Time Division Multiple Access), LTE (Long Term Evolution), etc.

Although the various embodiments have been described above with reference to the accompanying drawings, the present disclosure is not limited to the embodiments, and the embodiments may be implemented in different various forms. A person having common knowledge in the technical field to which the present disclosure belongs will appreciate that the present disclosure may be embodied in other specific forms without changing the technical spirit of the present disclosure. Therefore, it should be understood that the embodiments as described above are illustrative in all respects and not restrictive.

What is claimed is:

1. A unit pixel comprising:
   a first photoelectric converter;
   a first transfer transistor disposed between the first photoelectric converter and a first node and connected to the first photoelectric converter and the first node;
   a connection transistor disposed between a second node and the first node and connected to the second node and the first node;
   a second transfer transistor disposed between a third node and the second node and connected to the third node and the second node;
   a second photoelectric converter connected to the third node;
   a storage MOS (metal-oxide semiconductor) capacitor connected to the third node, wherein the storage MOS capacitor stores charges from the second photoelectric converter; and
   a capacitor connected to a fourth node disposed between the second node and the second transfer transistor, the fourth node being connected to the second node and the second transfer transistor.

2. The unit pixel of claim 1, wherein the capacitor stores overflow charges which have overflowed from the second photoelectric converter.

3. The unit pixel of claim 2, wherein the unit pixel further comprises a reset transistor disposed between the second node and a fifth node and connected to the second node, wherein the capacitor is connected to a sixth node.

4. The unit pixel of claim 1, wherein a first combined capacitance that includes a capacitance of the first photoelectric converter and a capacitance of the first node is smaller than a second combined capacitance that includes a capacitance of the first photoelectric converter, a capacitance of the first node and a capacitance of the second node,
   wherein the second combined capacitance is smaller than a third combined capacitance that includes a capacitance of the first node, a capacitance of the second node, and a capacitance of the third node.

5. The unit pixel of claim 1, wherein the storage MOS capacitor is disposed between the third node and the second photoelectric converter and connected to the third node and the second photoelectric converter.

6. The unit pixel of claim 1, wherein the storage MOS capacitor is disposed between the third node and the second node and connected to the third node and the second node and is connected in parallel to the second transfer transistor.

7. The unit pixel of claim 1, wherein the first photoelectric converter is larger than the second photoelectric converter.

8. An image sensor comprising:
   a pixel array including unit pixels; and
   a read-out circuit,
   wherein each of the unit pixels includes:
   a first photoelectric converter;
   a source follower connected to the read-out circuit;
   a first transfer transistor disposed between the first photoelectric converter and the source follower and connected to the first photoelectric converter and the source follower;
   a second photoelectric converter different from the first photoelectric converter;
   a second transfer transistor having one end connected to the second photoelectric converter;
   a connection transistor configured to connect the other end of the second transfer transistor to the first transfer transistor and to the source follower;
   a capacitor having one end connected to the other end of the second transfer transistor and to the source follower; and a storage MOS capacitor having one end connected to the second photoelectric converter, wherein the storage MOS capacitor stores charges from the second photoelectric converter.

9. The image sensor of claim 8, wherein each of the unit pixels includes a first area including the first photoelectric converter and a second area including the second photoelectric converter,
wherein a size of the first area is greater than a size of the second area.

10. The image sensor of claim 8, wherein each of the unit pixels includes:
a third photoelectric converter that is different from each of the first photoelectric converter and the second photoelectric converter; and
a third transfer transistor having one end connected to the third photoelectric converter, wherein the third transfer transistor is connected to the connection transistor.

11. The image sensor of claim 8, further comprising a substrate,
wherein the first photoelectric converter and the second photoelectric converter of each of the unit pixels are embedded in the substrate,
wherein a gate of the second transfer transistor is disposed in the substrate.

12. The image sensor of claim 11, wherein a gate of the storage MOS capacitor is disposed in the substrate.

13. The image sensor of claim 8, wherein the first photoelectric converter is larger than the second photoelectric converter.

14. A method of operating a unit pixel that includes:
a first photoelectric converter,
a first transfer transistor disposed between the first photoelectric converter and a first node and connected to the first photoelectric converter and the first node,
a connection transistor disposed between a second node and the first node and connected to the second node and the first node,
a second transfer transistor disposed between a third node and the second node and connected to the third node and the second node,
a second photoelectric converter connected to the third node, and
a storage MOS (metal-oxide semiconductor) capacitor connected to the third node, the method comprising:
for a first time period, transferring first charges accumulated in the first photoelectric converter to the first node via the first transfer transistor, and outputting a first signal voltage corresponding to the first charges from the unit pixel;
for a second time period following the first time period, transferring second charges accumulated in the first photoelectric converter to the first node and the second node via the first transfer transistor and the connection transistor, and outputting a second signal voltage corresponding to the second charges from the unit pixel; and
for a third time period following the second time period, transferring third charges accumulated in the second photoelectric converter to the first node, the second node, and the third node via the second transfer transistor and the connection transistor, and outputting a third signal voltage corresponding to the third charges from the unit pixel,
wherein the storage MOS capacitor stores charges from the second photoelectric converter.

15. The method of claim 14, wherein, for a fourth time period between the second time period and the third time period, outputting a fourth signal voltage into which charges accumulated in the first node, the second node and the fourth node are converted from the unit pixel.

16. The method of claim 14, further comprising pulling down a storage gate signal that is applied to a gate of the storage MOS capacitor when a second transfer gate signal applied to a gate of the second transfer transistor is pulled-up.

17. The method of claim 16, wherein after the second transfer gate signal is pulled-down, the storage gate signal is pulled-up.

18. The method of claim 14, wherein the unit pixel further comprises a reset transistor disposed between the second node and a fifth node and connected to the second node and the fifth node to which a first voltage is applied,
wherein the capacitor is connected to a sixth node to which a second voltage different from the first voltage is applied, and
wherein the second voltage applied in the third time period is greater than the second voltage applied in each of the first time period and the second time period.

* * * * *